US011914013B2

(12) United States Patent
Yu et al.

(10) Patent No.: US 11,914,013 B2
(45) Date of Patent: Feb. 27, 2024

(54) REAL-TIME IN SITU MONITORING OF SUSPENSION SEDIMENTATION USING WATER PROTON NMR

(71) Applicant: UNIVERSITY OF MARYLAND, BALTIMORE, Baltimore, MD (US)

(72) Inventors: Yihua (Bruce) Yu, Ellicott City, MD (US); Marc B. Taraban, North Potomac, MD (US)

(73) Assignee: UNIVERSITY OF MARYLAND, BALTIMORE, Baltimore, MD (US)

( * ) Notice: Subject to any disclaimer, the term of this patent is extended or adjusted under 35 U.S.C. 154(b) by 197 days.

(21) Appl. No.: 17/401,709

(22) Filed: Aug. 13, 2021

(65) Prior Publication Data

US 2022/0057464 A1     Feb. 24, 2022

Related U.S. Application Data

(60) Provisional application No. 63/067,085, filed on Aug. 18, 2020.

(51) Int. Cl.
| | |
|---|---|
| *G01R 33/50* | (2006.01) |
| *G01N 24/08* | (2006.01) |
| *G01N 15/04* | (2006.01) |
| *G01R 33/34* | (2006.01) |

(52) U.S. Cl.
CPC ............. *G01R 33/50* (2013.01); *G01N 15/04* (2013.01); *G01N 24/082* (2013.01); *G01R 33/34092* (2013.01)

(58) Field of Classification Search
None
See application file for complete search history.

(56) References Cited

U.S. PATENT DOCUMENTS

| | | |
|---|---|---|
| 8,314,618 B2 | 11/2012 | Bieri et al. |
| 8,854,038 B2 | 10/2014 | Hernando et al. |
| 8,862,407 B2 | 10/2014 | Chugunov et al. |
| 9,194,925 B2 | 11/2015 | Zhong et al. |
| 10,267,754 B2 | 4/2019 | Yu et al. |
| 10,514,347 B2 | 12/2019 | Yu et al. |
| 2004/0090231 A1 | 5/2004 | Augustine et al. |
| 2005/0287527 A1 | 12/2005 | Ni et al. |
| 2006/0269965 A1 | 11/2006 | Josephson |
| 2007/0116602 A1 | 5/2007 | Lee |
| 2010/0047180 A1 | 2/2010 | Zeng et al. |
| 2010/0072994 A1 | 3/2010 | Lee et al. |

(Continued)

FOREIGN PATENT DOCUMENTS

WO    2021/127309    6/2021

OTHER PUBLICATIONS

Baldock, T. E.; Tomkins. M. R.; Nielsen, P.; Hughes, M. G. Settling velocity of sediments at high concentrations. Coast, Eng. 2004, 51, 91-100.

(Continued)

*Primary Examiner* — Jay Patidar
(74) *Attorney, Agent, or Firm* — Casimir Jones, SC; Tristan A. Fuierer

(57) ABSTRACT

A method for using water proton transverse relaxation rate $R_2(T)$ to monitor, in real time, the sedimentation rates of multiphase mixtures such as drug products and drug substances. The method provides a practical application of wNMR as an analytical tool to study and provide higher quality and more efficient multiphase mixtures.

10 Claims, 5 Drawing Sheets

(56) References Cited

U.S. PATENT DOCUMENTS

| | | |
|---|---|---|
| 2010/0278829 A1 | 11/2010 | Edwards, III et al. |
| 2011/0124744 A1 | 5/2011 | Lee et al. |
| 2012/0100546 A1 | 4/2012 | Lowery et al. |
| 2012/0164644 A1 | 6/2012 | Neely et al. |
| 2013/0244238 A1 | 9/2013 | Neely et al. |
| 2013/0265054 A1 | 10/2013 | Lowery, Jr. |
| 2016/0047761 A1 | 2/2016 | Yu et al. |
| 2019/0293579 A1 | 9/2019 | Yu et al. |
| 2019/0391218 A1 | 12/2019 | Yu et al. |
| 2020/0110046 A1 | 4/2020 | Yu et al. |

OTHER PUBLICATIONS

Barfod, N. Concentration dependence of sedimentation rate of particles in dilute suspensions. Powder Technol. 1972, 6, 39-43.

Davies, R. The experimental study of the differential settling of particles in suspensions at high concentrations. Powder Technol. 1968, 2, 43-51.

Dey, S.; Ali, S. Z.; Padhi, E. Terminal fall velocity: The legacy of Stokes from the perspective of fluvial hydraulics. Proc. R. Soc. A 2019, 475, 20190277.

Exley, C.; Siesjö, P.; Eriksson, H. The immunobiology of aluminium adjuvants: How they really work? Trends Immunol. 2010, 31, 103-109.

Farrell, C. Analytical control strategies for aluminum adjuvants. WCBP 2014, https://www.casss.org/resource/resmgr/WCBP_Speaker_Slides/2014_WCBP_Chris_Farrell.pdf.

Fox, C. B. Characterization of TLR4 agonist effects of Alhydrogel® sedimentation: A novel application of laser scattering optical profiling. J. Pharm. Sci. 2012, 101, 4357-4364.

Guo, J.; Lewis, L. M.; Billones, H.; Torres, E.; Kolhe, P. The effect of shipping stresses on vaccine re-dispersion time. J. Pharm. Sci. 2016, 105, 2009-2013.

Gupta, R. K. aluminum compounds as vaccine adjuvants. Adv. Drug Deliv. Rev. 1998, 32, 155-172.

Hiestand, E. N. Theory of coarse suspension formulation. J. Pharm. Sci. 1964, 53, 1-18, Can Only Locate First Page.

Hogenesch, H.; O'Hagan, D. T .; Fox, C. B. Optimizing the utilization of aluminum adjuvants in vaccines: you might just get what you want. NPJ Vaccines 2018, 3, 51.

Jayaweera, K. O. L. F .; Mason, B. J .; Slack, G. W. The behavior of clusters falling in a viscous fluid. J. Fluid. Mech. 1964, 20, 121-128.

Jovanovic, D. S. A quantitative study of orthokinetic flocculation in suspension. Kolloid-Z. Polymere 1965, 203, 42-56.

Kurztowski, W.; Kartğlu, Ü .; Staniszewska, M .; Górska, P.; Krause, A.; Wysocki, M. J. Structural damages in adsorbed vaccines affected by freezing. Biologicals 2013, 41, 71-76, Abstract Only.

Kurztowski, W.; Kartğlu, Ü .; Górska, P.; Glówka, M.; Woźnica, K.; Zasada, A. A.; Szczepańska, G.; Trykawski, G.; Gniadek, M.; Donten, M. Physical and chemical changes in AlhydrogelTM damaged by freezing. Vaccine 2018, 36, 6902-6910.

Angford, A.; Horwitz, T .; Adu-Gyamfi, E.; Wiley, C.; Holding, E.; Zimmermann, D.; Ignatius, A. A.; Ohtake, S. Impact of formulation and suspension properties on redispersion of aluminum-adjuvanted vaccines. J. Pharm. Sci. 2020, 109, 1460-1466, Abstract Only.

Lewis, L. M.; Guo, J.; Torres, E.; Wang, J.; Billones, H.; Kolhe, P.; Young, A. L.; Bates, D.; Parker, A.; Rigby-Singleton, S. Ex situ and in situ characterization of vaccine suspensions in pre-filled syringes. J. Pharm. Sci. 2017, 106, 2163-2167.

Meiboom, S.; Gill, D. Modified spin-echo method for measuring nuclear relaxation times. Rev. Sci. Instrum. 1958, 29, 688-691.

Muthurania, K.; Ignatius, A. A.; Jin, Z.; Williams, J.; Ohtake, S. Investigation of the sedimentation behavior of aluminum phosphate: Influence of pH, ionic strength, and model antigens. J. Pharm. Sci. 2015, 104, 3770-3778.

Nutan, M. T. H.; Reddy, I. R. General principles of suspensions. In: Kulshreshita, A.; Singh, O.; Wall, G. (eds.) Pharmaceutical Suspensions: From Formulation to Manufacturing, New York, Springer 2010, 39-65.

Reed, S. G.; Orr, M. T.; Fox, C. B. Key roles of adjuvants in modern vaccines. Nat. Med. 2013, 19, 1597-1608.

Salnikova, M. S.; Davis, H.; Mensch, C.; Celano, L.; Thiriot, D. S. Influence of formulation pH and suspension state on freezing-induced agglomeration of aluminum adjuvants. J. Pharm. Sci. 2012, 101, 1050-1062.

Shardlow, E.; Mold, M.; Exley, C. From stock bottle to vaccine: Elucidating the particle size distributions of aluminum adjuvants using dynamic light scattering. Front. Chem. 2017, 4, 48.

Taraban, M. B.; Fox, C. B.; Yu, Y. B. Assessing aluminum vaccine adjuvant filling, sedimentation, and resuspension in sealed vials using water proton NMR. Am. Pharm. Rev. 2019, 22, 70-73.

Vecchi, S.; Bufali, S.; Skribinski, D. A. G.; O'Hagan, D. T.; Singh, M. Aluminum adjuvant dose guidelines in vaccine formulation for preclinical evaluations. J. Pharm. Sci. 2012, 101, 17-20.

Briggs, K.T., Taraban, M.B., Yu, Y.B. (2018) Water proton NMR detection of amide hydrolysis and diglycine dimerization. Chem. Comm. 54, 7003-7006.

Metz, H., Mäder, K., (2008) Benchtop-NMR and MRI—a new analytical tool in drug delivery research, Int. J. Pharm., 364, 170-175.

Rohrer, M, Bauer, H., Mintorovitch, Jan., Requardt, M., Weinmann, H.J., (2005) Comparison of magnetic properties of MRI contrast media solutions at different magnetic field strengths. Invest. Radiol. 40, 715-724.

Yu, Y.B., Feng, Y., Taraban, M.B. (2017) Water proton NMR for noninvasive chemical analysis and drug product inspection. Am. Pharmaceut. Rev. 20, 34-39.

Taraban, M.B., Truong, H.C., Feng, Y., Jouravleva, E.V., Anisimov, M.A., Yu, Y.B., (2015) Water Proton NMR for In Situ Detection of Insulin Aggregates, J. Pharm. Sci., 104, 4132-4141.

Taraban, M.B., DePaz, R.A., Lobo, B., Yu, Y.B. (2017) Water proton NMR: a tool for protein aggregation characterization. Anal. Chem. 89, 5494-5502.

Taraban, M.B., Truong, H., Ilavsky, J., DePaz, R.A., Lobo, B., Yu, Y.B. (2017) Non-invasive detection of nanoparticle clustering by water proton NMR. Transl. Mater. Res. 4, 025002.

Taraban, M.B., Briggs, K.T., Merkel, P., Yu, Y.B., Flow Water Proton NMR: In-Line Process Analytical Technology for Continuous Biomanufacturing (2019) Anal. Chem. 91, 13538-13546.

Taraban, M. et al.; "Water Flow-NMR—A Prospective Contact-Free In-Line Analytical Tool for Continuous Biomanufacturing," Mar. 3, 2019, PANIC 2019 conference (Practical Applications of NMR in Industry Conference), Poster.

Baroni, et al.; "Relaxometric Characterization of Balsamic Vinegar," meeting abstract 6th Conference on Field Cycling NMR Relaxometry Turin (Italy) Jun. 4, 2009.

Bloembergen, N. et al.; "Relaxation Effects in Nuclear Magnetic Resonance absorption," Phys. Rev. 1948, 73, 679-712.

Feng, Y., Taraban, M.B., Yu, Y.B. (2011) Linear dependency of NMR relaxation rates on shear modulus in hydrogels. Soft Matter, 7, 9890-9893.

Feng, Y., Taraban, M.B., Yu, Y.B., (2015) Water Proton NMR—A Sensitive Probe for Solute Association, Chem. Commun., 51, 6804-6807.

FIGURE 2(a)
FIGURE 2(b)
[Al(III)]
5.0 mg/mL
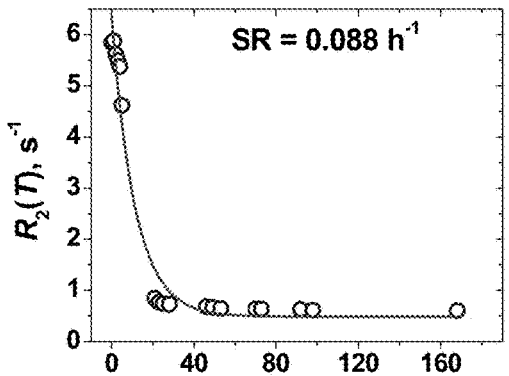
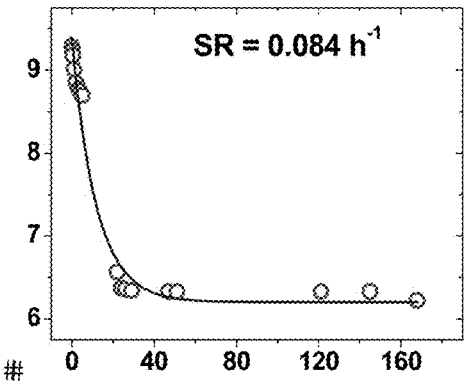
2.0 mg/mL
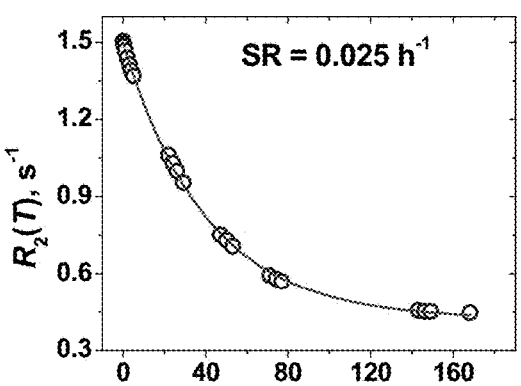
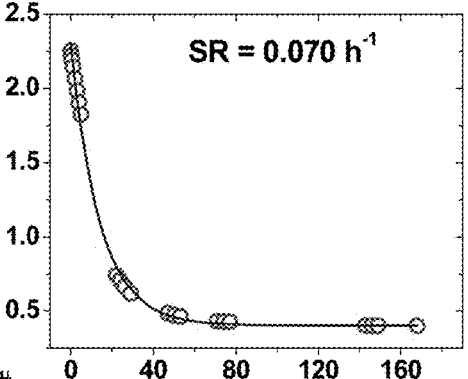
1.0 mg/mL
0.5 mg/mL
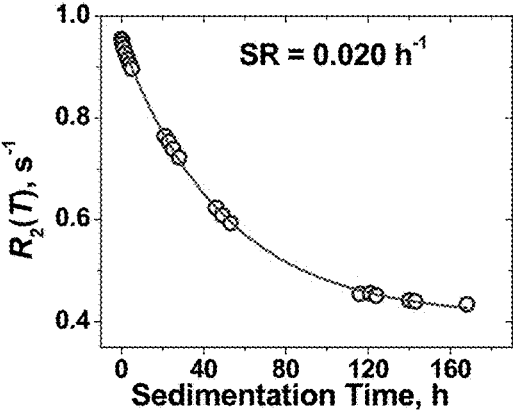
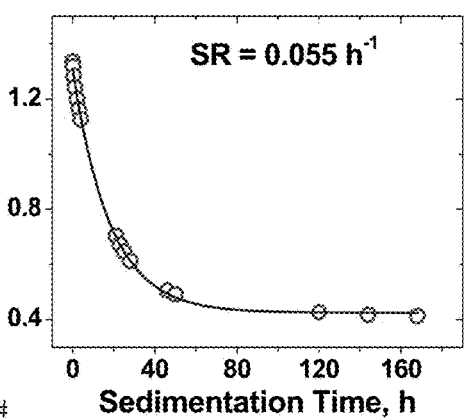

FIGURE 4(a)
FIGURE 4(b)
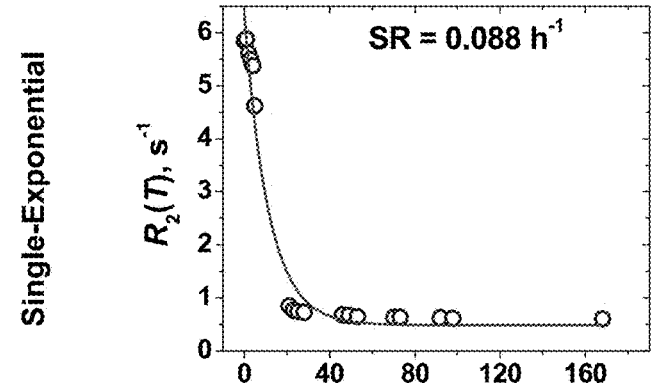
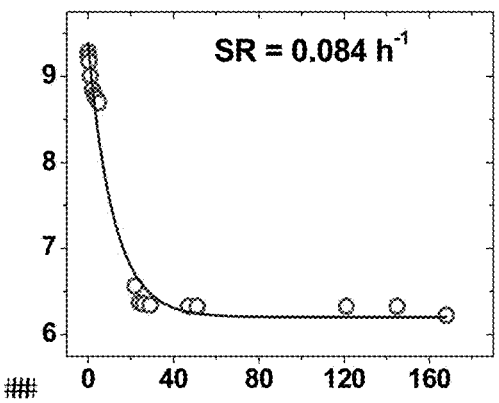
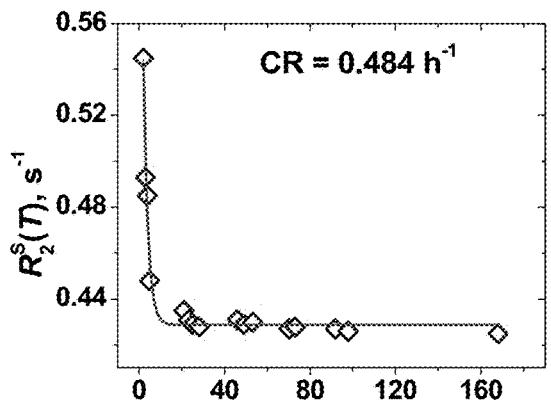
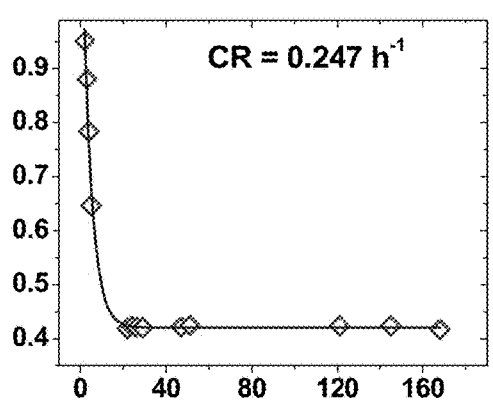
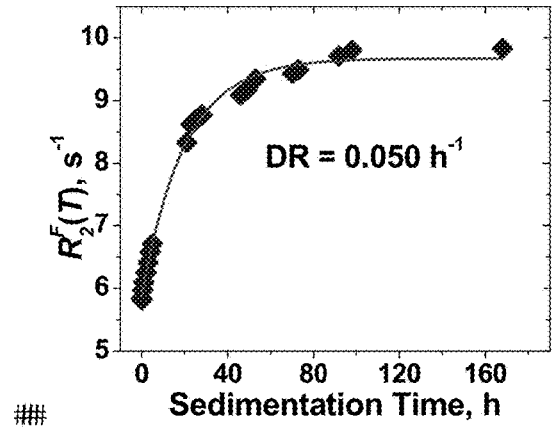
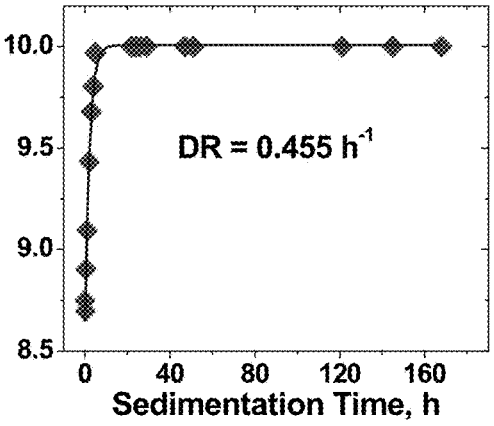

REAL-TIME IN SITU MONITORING OF SUSPENSION SEDIMENTATION USING WATER PROTON NMR

CROSS REFERENCE TO RELATED APPLICATIONS

This application is filed under the provisions of 35 U.S.C. § 111(a) and claims priority to U.S. Provisional Patent Application No. 63/067,085 filed on Aug. 18, 2020 in the name of Yihua (Bruce) YU and Marc B. Taraban and entitled "Real-Time In Situ Monitoring of Suspension Sedimentation Using Water Proton NMR," which is hereby incorporated by reference herein in its entirety.

STATEMENT OF FEDERAL SUPPORT

This invention was made with government support under Contract No. 75F40119C10104 awarded by the Food and Drug Administration. The government has certain rights in the invention.

FIELD

The present invention relates to methods for determining the stability of multiphase mixtures, for example drug products and drug substances, using solvent nuclear magnetic resonance (NMR).

DESCRIPTION OF THE RELATED ART

Sedimentation processes and their characteristics are the long-standing area of extensive research due to the great importance of these processes for various industrial applications. Particle size, surface charge, and particle concentration define the hydrodynamic parameters of suspended solids important for the formulation and quality control of many products including, but not limited to, cosmetics, paints, inks, polymers, and pharmaceuticals (Nutan, M. T. H., et al., 2010).

Currently employed techniques for measuring the sedimentation rate and sedimentation volume ratio (SVR) include: (a) a graduated Wintrobe tube (110 mm long, 3 mm bore diameter) for visual monitoring of the sedimentation rate based on the dynamics of the phase separation interface over time (Farrell, C., 2014), as affected by the surface tension and capillary forces (due to the rather small bore diameter of the tube), which is based on visual observations; (b) using laser scattering analyzers (Fox, C. B., 2012); and (c) optical scanner analyzers (Langford, A., et al., 2020; Muthurania, K., et al., 2015) which provide simultaneous detection of light transmission and backscattering intensity to monitor sedimentation process and to obtain settling onset time, sedimentation rate and SVR.

A variety of units are used to represent sedimentation rates measured by the many different techniques. For example, length per time units, such as mm/min or mm/h, are used when analyses employ the Wintrobe tubes (Farrell, C., 2014), and sometimes the same units could be derived from the laser transmission and backscattering data of optical scanning analyzer (Langford, A., et al., 2020). The direct analysis of the sedimentation process using laser transmission and backscattering data typically gives the sedimentation rate in the unit of integral transmission (%) per time (Fox, C. B., 2012). Units of optical absorbance changes per time are used when the sedimentation rate is measured via monitoring of the UV-absorption of the supernatant layer (Guo, J., et al., 2016; Lewis, L. M., et al., 2017). In some cases, the sedimentation rate is expressed as a time to completion of the sedimentation process-until no further changes in the height (thickness) of a sediment were observed (Kurzatowski, W., et al., 2013; Kurzatowski, W., et al., 2018). This divergence of units for sedimentation rates measured by different techniques reflects that only relative values are needed for comparing different pharmaceutical suspension formulations of the same active pharmaceutical ingredients.

There is a need to develop a more straightforward technique capable of monitoring and characterizing the stability and shelf-life of emulsions, suspensions, and foams regardless of the stage of processing, e.g., R&D, pre-formulation, upscaling, and quality control. Preferably, such technique should not place stringent requirements on the sample volume and container transparency and the technique does not rely on visualization or the use or measurement of photons. In one embodiment, the technique does not necessitate the transfer of a sample to a specialized tube/cuvette. The capability to measure sedimentation parameters will make it possible to study the stability of raw materials and the final product, e.g., a drug product or a drug substance, to analyze its vial-to-vial variability as well as to perform quality control before and after the release of the finished products. Towards that end, the present invention relates to a method of using the relaxation rate of a solvent NMR signal to determine if a multiphase mixture is stable. Advantageously, the method described herein is easy to use, can be noninvasive, provides results in real-time, and is highly sensitive.

SUMMARY

In a first aspect, a method of determining the sedimentation rate of solids in a multiphase mixture sample using wNMR is described, said method comprising:
  inserting a vial comprising the multiphase mixture sample into a nuclear magnetic resonance (NMR) spectroscopy probe;
  determining the transverse relaxation rate of water $R_2(^1H_2O, T)$ of the multiphase mixture sample at time T over a total time $T_{total}$;
  calculating the multiphase mixture sample sedimentation rate ($SR_{sample}$); and
  comparing the multiphase mixture sample $SR_{sample}$ to an approved control sedimentation rate ($SR_{cont}$) for the multiphase mixture, wherein if the multiphase mixture sample $SR_{sample}$ is outside of an acceptable range of the approved $SR_{cont}$, the multiphase mixture sample is less stable relative to an approved multiphase mixture.

In a second aspect, a method of determining the approximate shelf-life of a multiphase mixture using wNMR is described, said method comprising:
  inserting a vial comprising the multiphase mixture sample into a nuclear magnetic resonance (NMR) spectroscopy probe, wherein a set temperature of the probe is in a range from about 2° C. to about 150° C.;
  determining the transverse relaxation rate of water $R_2(^1H_2O, T)$ of the multiphase mixture sample at the set temperature at time T over a total time $T_{total}$;
  calculating the multiphase mixture sample sedimentation rate ($SR_{sample}$); and
  comparing the multiphase mixture sample $SR_{sample}$ to a sedimentation rate SR of at least one control of the multiphase mixture having known shelf-life, wherein the shelf-life of the multiphase mixture sample is approximated based on the control having the closest sedimentation rate.

In a third aspect, a method of determining the sedimentation volume ratio (SVR) of a multiphase mixture sample using wNMR is described, said method comprising:

inserting a vial comprising the multiphase mixture sample into a nuclear magnetic resonance (NMR) spectroscopy probe;

tracking supernatant of the multiphase mixture sample during sedimentation and determining a pre-exponential factor $I_o^S(T)$ at T=total time $T_{total}$ using biexponential fitting of a Carr-Purcell-Meiboom-Gill (CPMG) echo signal decay;

tracking sediment of the multiphase mixture sample during sedimentation and determining a pre-exponential factor $I_o^F(T)$ at T=total time $T_{total}$ using biexponential fitting of a CPMG echo signal decay; and calculating the $SVR^{NMR}$ of the multiphase mixture sample, wherein the $SVR^{NMR}$ is compared to an SVR control for a multiphase mixture ($SVR^{control}$), wherein a $SVR^{NMR}$ less than $SVR^{control}$ is indicative of higher density and compactness of sediment in the multiphase mixture sample relative to the control and wherein $SVR^{NMR}$ greater than $SVR^{control}$ is indicative of lower density and compactness of sediment in the multiphase mixture sample relative to the control.

In a fourth aspect, a method of determining the clarification rate (CR) of supernatant and/or the densification rate (DR) of sediment in a multiphase mixture sample, said method comprising: inserting a vial comprising the multiphase mixture sample into a nuclear magnetic resonance (NMR) spectroscopy probe;

tracking sedimentation of the multiphase mixture sample and determining a supernatant relaxation component $R_2^S(T)$ and a sediment relaxation component $R_2^F(T)$ of the multiphase mixture sample at time intervals T over a total time $T_{total}$;

calculating (a) the multiphase mixture sample clarification rate ($CR_{sample}$), (b) the multiphase mixture sample densification rate ($DR_{sample}$), or (c) both (a) and (b); and at least one of (i) comparing the multiphase mixture sample $CR_{sample}$ to an approved control clarification rate ($CR_{cont}$) for the multiphase mixture, wherein if the multiphase mixture sample $CR_{sample}$ is less than an acceptable range of the approved $CR_{cont}$, the multiphase mixture sample is experienced hindered settling effects relative to an approved multiphase mixture and if the multiphase mixture sample $CR_{sample}$ is greater than an acceptable range of the approved $CR_{cont}$, the multiphase mixture sample is experienced enhanced settling effects relative to an approved multiphase mixture, (ii) comparing the multiphase mixture sample $DR_{sample}$ to an approved control densification rate ($DR_{cont}$) for the multiphase mixture, wherein if the multiphase mixture sample $DR_{sample}$ is greater than an acceptable range of the approved $DR_{cont}$, the particles in the multiphase mixture sample are larger than the particles in an approved multiphase mixture and vice versa, or (iii) both (i) and (ii).

Other aspects, features and advantages of the invention will be more fully apparent from the ensuing disclosure and appended claims.

BRIEF DESCRIPTION OF THE DRAWINGS

FIG. 2(a) illustrates the water proton transverse relaxation rate $R_2(T)$ vs. time response to sedimentation of ALHYDROGEL at different Al(III) concentrations: The values of sedimentation rate (SR) are the characteristic rate of $R_2(T)$ decrease vs. time derived from single exponential fitting (solid line) of the data (hollow circles). Data shown are the arithmetic means of three consecutive measurements, standard deviation in all cases is ±0.001 $s^{-1}$.

FIG. 2(b) illustrates the water proton transverse relaxation rate $R_2(T)$ vs. time response to sedimentation of ADJU-PHOS at different Al(III) concentrations: The values of sedimentation rate (SR) are the characteristic rate of $R_2(T)$ decrease vs. time derived from single exponential fitting (solid line) of the data (hollow circles). Data shown are the arithmetic means of three consecutive measurements, standard deviation in all cases is ±0.001 $s^{-1}$.

FIG. 4(a) illustrates single- and biexponential data analysis for ALHYDROGEL at [Al(III)]5.0 mg/mL, including the single exponential data sedimentation rates (SR), and the clarification (CR) and densification (DR) rates derived from the biexponential analysis of CPMG echo signal decay, wherein the dependence of slow $R_2^S(T)$ and fast $R_2^F(T)$ components of the water proton relaxation rate over time reflects formation of supernatant and sediment, respectively. Data shown are the arithmetic means of three consecutive measurements, standard deviation in all cases is ±0.001 $s^{-1}$ (not shown for clarity).

FIG. 4(b) illustrates single- and biexponential data analysis for ADJU-PHOS at [Al(III)] 5.0 mg/mL, including the single exponential data sedimentation rates (SR), and the clarification (CR) and densification (DR) rates derived from the biexponential analysis of CPMG echo signal decay, wherein the dependence of slow $R_2^S(T)$ and fast $R_2^F(T)$ components of the water proton relaxation rate over time reflects formation of supernatant and sediment, respectively. Data shown are the arithmetic means of three consecutive measurements, standard deviation in all cases is ±0.001 $s^{-1}$ (not shown for clarity).

DETAILED DESCRIPTION, AND PREFERRED EMBODIMENTS THEREOF

Figure 1A:
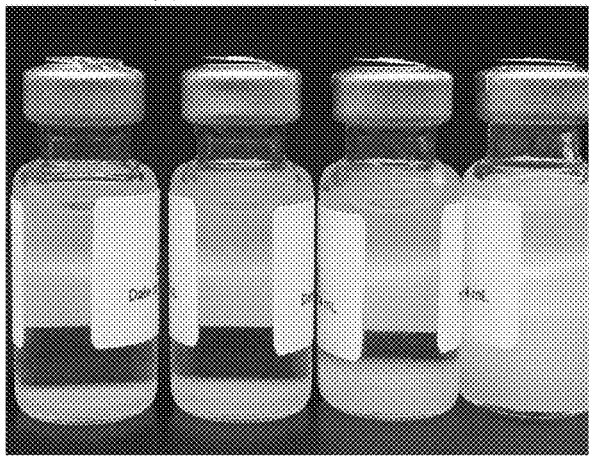
FIG. 1(a) illustrates samples of ALHYDROGEL after 168 h of sedimentation. Adjuvant concentration is [Al(III)] 0.5 mg/mL, 1.0 mg/mL, 2.0 mg/mL, 5.0 mg/mL (from left to right).

The present invention generally relates to a method of using NMR relaxation times or rates of solvent molecules, e.g., water, to determine if a multiphase mixture, e.g., a drug product or a drug substance, is stable as well as to determine the shelf-life of the multiphase mixture.

As defined herein, a "raw material" includes any reactant used to make a "product" of an "industry" including, but not limited to, the cosmetic industry, the food industry, the paint industry, the ink industry, the polymer industry, the pharmaceutical industry, the mining industry, waste and water treatment industry, environmental protection (e.g., disaster liquidation activities, ecological control) and the oil/gas industry. Reference will be made to a drug substance and drug product hereinafter, however, the disclosure is not intended to be limited to same.

As defined herein, a "drug substance" or "DS" comprises at least one active pharmaceutical ingredient (API), including biologics and small molecules (i.e., non-biologics), in an aqueous medium. The drug substance is formulated as an emulsion, a suspension, a foam, or a solution. Reference to multiphase mixtures hereinafter is intended to refer to an emulsion, a suspension, a foam, or a solution comprising at least one drug substance. The multiphase mixture can further comprise at least one excipient including, but not limited to, at least one adjuvant, at least one surfactant, at least one water-soluble organic solvent, at least one dispersant, at least one biocide, at least one buffering agent, at least one pH adjusting agent (e.g., acids and/or bases), at least one peptide, at least one antimicrobial, at least one polypeptide, at least one protein, at least one nucleic acid, at least one oil, or any combination thereof, as readily determined by the person skilled in the art. The multiphase mixture can be transparent or milky or opaque or has color. In one embodiment, the multiphase mixture can comprise a protein or a peptide. In another embodiment, the multiphase mixture is substantially devoid of any proteins or peptides. In still another embodiment, the multiphase mixture is a vaccine. Reference will be made to the multiphase mixture comprising a drug substance being a suspension hereinafter, however, the disclosure is not intended to be limited to same.

As defined herein, "DP" is a drug product, which is the combination of the DS plus the container or vial. In other words, DP refers to filled (partially or fully), sealed and labeled vials comprising the DS, wherein the DP is ready for distribution.

As defined herein, a "solid" corresponds to any non-dissolved solute in a multiphase mixture including, but not limited to, colloids, aggregates, (nano)crystals, salts, sugars, adjuvants, (nano)particles, bacteria, peptides, proteins, liposomes, carbohydrates, nucleic acids, polysaccharides, antibodies, excipients, and any combination thereof. It should be appreciated that the "solid" can be insoluble or partially soluble in a solvent of the multiphase mixture. It should be appreciated that at least one solvent of the multiphase mixture comprises water.

"Substantially devoid" is defined herein to mean that none of the indicated substance is intentionally added to or present in the composition.

As defined herein, the "approved SR" corresponds to the sedimentation rate (SR) determined by the manufacturer as the acceptable or control SR, or range of acceptable or control SR, for that multiphase mixture at the specific concentration.

As defined herein, the "approved CR" corresponds to the clarification rate (CR) of supernatant determined by the manufacturer as the acceptable or control CR, or range of acceptable or control CR, for that multiphase mixture at the specific concentration.

As defined herein, the "approved DR" corresponds to the densification rate (DR) of the sediment determined by the manufacturer as the acceptable or control DR, or range of acceptable or control DR, for that multiphase mixture at the specific concentration.

As defined herein, $R_2(^1H_2O, T)$ is the transverse relaxation rate of water as a function of time T.

As defined herein, a "vial" corresponds to a container, vessel, bottle, syringe, injection pen, or ampoule used to contain the multiphase mixture for measurement or distribution, wherein the vial comprises glass, plastic, ceramic, rubber, elastomeric material, and/or any non-magnetic metal. The vial can have a screw top, a top that is closed using a cork or plastic stopper, a crimp vial (closed with a rubber stopper and a metal cap), a flip-top or snap cap. The vial can be tubular or have a bottle-like shape with a neck. Other types and shapes of vials used to contain multiphase mixtures as well as caps are readily understood by the person skilled in the art. The vials can be optically transparent or not optically transparent. There is no need to peel off any label on the vial, whether the label is transparent or not.

As defined herein, a "non-destructive" measurement is defined as a measurement performed without opening the vial or otherwise accessing, harming, or altering the contents of the vial (for example by withdrawing a portion through a rubber gasket). Alternatively, or in addition to not accessing the contents of a vial, a non-destructive measurement means that no additives or probes or the like (e.g., magnetic particles) are added to the vial prior to the measurement of the specific value using NMR, for example, $R_1(^1H_2O, T)$, $R_2(^1H_2O, T)$, $R_2^S(T)$, $R_2^F(T)$. Non-destructive also means that there is no need to make the vials optically transparent and no need to peel off any labels on the vials.

As defined herein, an "alum-containing product" includes a product with nano- and micron-sized particles comprising aluminum and suspended in a solvent or a mixture of solvents. The alum-containing product can further comprise at least one surfactant, at least one water-soluble organic solvent, at least one dispersant, at least one biocide, at least one buffering agent, at least one pH adjusting agent (e.g., acids and/or bases), with or without antigens, or any combination thereof, as readily determined by the person skilled in the art. Many vaccines are alum-containing products because of the presence of an aluminum adjuvant.

As defined herein, "alum" corresponds to aluminum-containing salts comprising one or more of aluminum hydroxide, aluminum phosphate, alum ($KAl(SO_4) \cdot 12H_2O$), aluminum hydroxyphosphate sulfate, as well as other known or proprietary aluminum salts that can be used as alum adjuvants or in pharmaceutical products comprising aluminum.

In general, suspensions form an important class of pharmaceutical formulations. Suspension formulations are known to increase the stability of active ingredients which otherwise could degrade if dissolved in homogeneous solution (Nutan, M. T. H., et al., 2010). Suspensions also provide a means for controlled and/or sustained drug release when administered to a patient. It is important that a pharmaceutical suspension will settle slowly and can be easily resuspended when shaken (Id.). Excessively slow sedimentation rates could result in too dense and compact sediment on the bottom of the vial or container which would be hard to resuspend (Id.). Hence, the sedimentation rate as well as the sedimentation volume ratio characterizing the sediment compactness are informative parameters reflecting the hydrodynamic properties of suspensions.

Aluminum-adjuvanted vaccines are among the most widely administered pharmaceutical suspensions worldwide. The addition of adjuvants to some vaccine formulations is necessary because adjuvants play an important role of increasing the immunogenicity of antigens which might otherwise be incapable of inducing sufficient and prolonged immunological response if administered alone (Exley, C., et al., 2010). Insoluble aluminum salts are known to solicit stronger immunogenic response, and due to their relative safety and low costs are the most widely used vaccine adjuvants (Reed, S. G., et al., 2013; HogenEsch, H., et al., 2018). Stability of such aluminum-adjuvanted vaccine suspensions is generally considered as an important factor affecting the degree of an antigen adsorption which, in turn, is definitive to the adjuvanticity and design of potent vaccines (Gupta, R. K., 1998).

Hydrodynamic properties reflecting the stability of aluminum-adjuvanted vaccines are explored through the studies of their sedimentation rate and sedimentation volume ratio (SVR). Sedimentation rate is usually determined through the monitoring of the gradual settling of a suspension over time in graduated tubes/optical standard cuvettes (Farrell, C., 2014; Langford, A., et al., 2020). As such, due to the dependence on the tube size/material, the values of sedimentation rates are most commonly used for relative comparison purposes. SVR is the ratio of the sediment volume, either after 24 hours of monitoring or after completion of sedimentation, to the volume of the original suspension. If measured in identical cylindrical vials, SVR could be also expressed as a ratio of the height (thickness) of the final sediment to the height of the initial suspension. When measured for different formulations but with identical solid particles content, smaller SVR is indicative of higher density and compactness of a sediment and points to potential difficulties of its resuspension. Sedimentation rate (or interchangeably settling velocity) is the most evident property characterizing the stability of suspensions which in the case of aluminum-adjuvanted vaccines are prone to visually observable phase separation. Moreover, despite its known qualitative character (Hiestand, E. N., 1964)), SVR is still considered an important parameter helping to formulate pharmaceutical suspensions to avoid too dense sediment compaction. In addition to other factors, such as particle size, concentration (volume fraction), and surface charge, sedimentation characteristics of aluminum adjuvant particles in vaccine formulations could also depend on the interparticle interactions. Such interactions are affected by antigen adsorption on the surface of the adjuvant. Therefore, the parameters of the sedimentation process might also indirectly point to the characteristics of an antigen adsorption on the surface of an adjuvant particle—for example, it has been shown that more antigen molecules adsorbed on a particle surface accelerate the sedimentation and result in less tightly packed sediment (Fox, C. B., 2012).

Recent breakthrough developments in the instrumentation for nuclear magnetic resonance (NMR) spectroscopy and imaging have opened up opportunities to design novel analytical techniques for the pharmaceutical industry. Of special importance was the introduction of commercially available, relatively inexpensive benchtop and handheld NMR and magnetic resonance imaging (MRI) instruments and relaxometers (24). Benchtop NMR instruments enable highly accurate measurements of nuclear spin relaxation times $T_1$ and $T_2$. Moreover, most of these instruments have a permanent or electronically cooled magnet with the bore from 10 mm to 45 mm and even larger which provides a great flexibility in the measurements of vials of various sizes.

Water proton NMR (wNMR) monitors water, which acts as a reporter for solutes dissolved or suspended therein. As a reporter, water has two tremendous advantages. First, its concentration far surpasses that of any solute, by $10^3$-$10^6$-fold in most cases. This makes the $^1H_2O$ signal easily detectable by benchtop and handheld NMR instruments. Further, the solute changes can be detected through the solvent NMR signal. In addition, water is "endogenous" to all biomanufacturing processes and all drug products. This sets it apart from "exogenous" reporters such as fluorescent dyes or radiotracers.

The essence of wNMR is a consistency and/or comparative check, which makes it useful for the pharmaceutical industry, where consistency is both critical and expected. For example, wNMR can be used to detect and measure sedimentation in multiphase mixtures. Multiphase mixtures include, but are not limited to, emulsions where two or more liquid phases are mixed, or suspensions where if solid particles are dispersed in a liquid. The methods described herein can be used in any field where it is necessary to analyze the structure and/or stability of a multiphase mixture.

The changes of water proton transverse relaxation rate $R_2(T)$ during sedimentation vs. sedimentation time T could be conveniently used to monitor the sedimentation processes of multiphase mixtures such as aluminum adjuvant suspensions. The concentration-dependence of the sedimentation rates derived from $R_2(T)$ observations also serves as a reliable indicator of the onset of hindered settling conditions, which is necessary to understand to formulate stable pharmaceutical suspensions, especially at high concentration of solid particles. The present invention allows the manufacturer to better understand destabilization events such as flocculation, coalescence, sedimentation, and creaming, and modify the multiphase mixtures in real time to ensure the final multiphase mixture is stable and as efficacious as possible. In addition, wNMR allows one to analyze separately and simultaneously the buildup of supernatant and compaction of sediment during the sedimentation process in real time. Sedimentation volume ratio, which characterizes the density of a sediment and the possibility of its uniform and easy resuspension, can be accurately measured from biphasic analysis of the water proton echo signal intensity decay data. Accordingly, wNMR has a potential to find wide applications when formulating novel and efficient suspensions, e.g., pharmaceutical suspensions such as vaccines, as well as for quality control of their manufacturing.

In a first aspect, the present invention relates to a method of determining the sedimentation rate of solids in a multiphase mixture sample using wNMR, said method comprising:

inserting a vial comprising the multiphase mixture sample into a nuclear magnetic resonance (NMR) spectroscopy probe;

determining the transverse relaxation rate of water $R_2(^1H_2O, T)$ of the multiphase mixture sample at time T over a total time $T_{total}$;

calculating the multiphase mixture sample sedimentation rate ($SR_{sample}$); and comparing the multiphase mixture sample $SR_{sample}$ to an approved control sedimentation rate ($SR_{cont}$) for the multiphase mixture, wherein if the multiphase mixture sample $SR_{sample}$ is outside of an acceptable range of the approved $SR_{cont}$, the multiphase mixture sample is less stable relative to an approved multiphase mixture.

If the multiphase mixture sample is less stable, the manufacturer may be able to modify the batch the sample originated from, as readily understood by the person skilled in the art, or the batch the sample originated from should not be distributed.

More specifically, the multiphase mixture sample of the first aspect has a known concentration and the $SR_{sample}$ measured to determine if the multiphase mixture sample is stable relative to a known, stable, efficacious multiphase mixture (i.e., a control) at substantially the same concentration. The method of the first aspect does not rely on visualization or the use or measurement of photons or the use of backscattering detectors. Further, the method of the first aspect is performed without introducing any additives to the multiphase mixture sample prior to measurement. The vial may be sealed because the multiphase mixture sample is ready for distribution, i.e., a drug product, and the measurement of $SR_{cont}$ is made in situ, or the multiphase mixture sample may be dispensed to a vial directly from the manufacturing process for determining the $SR_{sample}$ before, during, or at the conclusion of the manufacturing process, i.e., a drug substance. The $SR_{sample}$ can be calculated in $h^{-1}$ by plotting the data and using the formula:

$$R_2(T) = R_2^0 \exp(-T \times SR_{sample}) + R_{2,0}$$

where $R_2^0$ is a pre-exponential factor at T=0, $R_2(T) = R_2^0 + R_{2,0}$ wherein $R_{2,0}$ is a baseline offset component equal to $R_2(T)$ at time $T \to \infty$. Time intervals T can be readily determined by the person skilled in the art, and can be equally spaced over total time $T_{total}$, or can be equally spaced immediately after the sedimentation rate experiment begins, with an increase in the length of the time intervals as sedimentation occurs. In other words, the time intervals over $T_{total}$ can be the same as or different from one another, as readily determined by the person skilled in the art. In one embodiment, the multiphase mixture comprises at least one drug substance. With regard to modification, if the multiphase mixture sample $SR_{sample}$ is outside of an acceptable range of the approved $SR_{cont}$ for the multiphase mixture, the manufacturer can check any of a number of characteristics of the multiphase mixture including, but not limited to, particle size distribution, the pH, the ionic strength, and particle concentration, and modify as necessary.

In practice, the manufacturer can provide or have previously identified the approved $SR_{cont}$ range in time$^{-1}$, e.g., a control or reference, for the substantially stable multiphase mixture at storage temperatures and specific magnetic field strength(s) (e.g., 0.5 T). The user will then determine the $SR_{sample}$ of the sample multiphase mixture, wherein the concentration of the drug substance contained therein is known to be substantially identical to the control, at the same magnetic field strength and compare the measured $SR_{sample}$ value with the manufacturer-approved range of $SR_{cont}$, i.e., control or reference, as understood by the person skilled in the art, to determine if the drug substance is substantially stable.

In addition to comparing a newly manufactured multiphase mixture sample to a previously manufactured multiphase mixture that is known to be stable and efficacious (i.e., a control), the method of the first aspect can be used to verify changes in manufacturing processes, safely bringing online new manufacturing facilities, and comparing a generic multiphase mixture to the pioneer multiphase mixture (e.g., for new drug approvals). For example, when comparing a generic multiphase mixture to a pioneer multiphase mixture, the multiphase mixture sample of the first aspect would be the generic and the pioneer multiphase mixture would be the control. In addition, the method of the first aspect can be used to identify counterfeits of a proprietary multiphase mixture. For example, when trying to detect counterfeits of a pioneer multiphase mixture, the multiphase mixture sample of the first aspect would be the alleged counterfeit and the pioneer multiphase mixture would be the control.

The method of the first aspect enables the assessment of the stability and quality of multiphase mixtures, for example drug products or drug substances, formulated in an aqueous medium, without the requirement of opening the vial or product container, without peeling off the label on the vial, without requiring any reagents for sample analysis, and/or without relying on visualization or the use or measurement of photons (e.g., light) or backscattered detection. The method can be quantitative and comprises measuring the nuclear spin relaxation rate constant, $R_2(H_2O, T)$, as a quality control and quality assurance parameter. Manufacturers and quality control regulators can readily use the method of the first aspect to determine if a multiphase mixture sample is stable and thus efficacious, as well as to identify if the multiphase mixture is a counterfeit of a pioneer product, i.e., the counterfeit product may have a SR that differs from that of the pioneer product. Additionally, the method of the first invention can be used during new drug approvals of generic products, wherein the generic multiphase mixture should have a SR similar to that of the pioneer product. The method of the first aspect can further be used during the manufacturing of the product, as a quality control check during production of the product, wherein a SR that is outside of an acceptable range is indicative of the occurrence of destabilization processes such as creaming, sedimentation, flocculation, or coalescence, and the product must be modified to stabilize same, as readily understood by the person skilled in the art.

It should be appreciated that the method of the first aspect can be carried out at standard storage temperatures. Alternatively, the method of the first aspect can be adapted to be carried out at higher than storage temperatures to intentionally accelerate destabilization, thereby providing an estimation of shelf-life of the multiphase mixture. For example, the SR of multiphase mixtures having a shelf-life of X months can be known and the experimental SR at higher temperatures can be determined and compared thereto to approximate the shelf-life.

According, in a second aspect, a method of determining the approximate shelf-life of a multiphase mixture using wNMR is described, said method comprising:

inserting a vial comprising the multiphase mixture sample into a nuclear magnetic resonance (NMR) spectroscopy probe, wherein a set temperature of the probe is in a range from about 2° C. to about 150° C.; determining the transverse relaxation rate of water $R_2(^1H_2O, T)$ of the multiphase mixture sample at the set temperature at time T over a total time $T_{total}$;

calculating the multiphase mixture sample sedimentation rate ($SR_{sample}$); and comparing the multiphase mixture sample $SR_{sample}$ to a sedimentation rate SR of at least one control of the multiphase mixture having known shelf-life, wherein the shelf-life of the multiphase mixture sample is approximated based on the control having the closest sedimentation rate.

It should be appreciated by the person skilled in the art that in practice, there may be a substantial number of $SR_{control}$, e.g., 2, 3, 4, 5, 6, 7, 8, 9, 10, 15, 20, 25, 30 or more, to compare the $SR_{sample}$ to, thereby ensuring the most precise shelf-life.

The method of the second aspect does not rely on visualization or the use or measurement of photons or use of backscattering detectors. Further, the method of the second aspect is performed without introducing any additives to the multiphase mixture sample prior to measurement. The vial may be sealed because the multiphase mixture sample is ready for distribution, i.e., a drug product, and the measurement of $SR_{sample}$ is made in situ, or the multiphase mixture sample may be dispensed to a vial directly from the manufacturing process for determining the $SR_{sample}$ before, during, or at the conclusion of the manufacturing process, i.e., a drug substance. The $SR_{sample}$ can be calculated in $h^{-1}$ by plotting the data and using the formula:

$$R_2(T) = R_2^0 \exp(-T \times SR_{sample}) + R_{2,0}$$

where $R_2^0$ is a pre-exponential factor at T=0, $R_2(T)=R_2^0+R_{2,0}$ wherein $R_{2,0}$ is a baseline offset component equal to $R_2(T)$ at time $T\to\infty$. Time intervals T can be readily determined by the person skilled in the art, and can be equally spaced over total time $T_{total}$, or can be equally spaced immediately after the sedimentation rate experiment begins, with an increase in the length of the time intervals as sedimentation occurs. In other words, the time intervals over $T_{total}$ can be the same as or different from one another, as readily determined by the person skilled in the art. In one embodiment, the multiphase mixture comprises at least one drug substance. The temperature is described as being in a range from about 2° C. to about 150° C. It should be appreciated that the maximum temperature chosen is dependent on the nature of the multiphase mixture as well as the NMR used and what temperature range is available on the instrument. For example, if the multiphase mixture comprises a drug substance, e.g., a vaccine or protein, the temperature range is preferably in a range from about 2° C. to about 80° C. Other industries may be able to benefit from using higher temperatures.

The method of the second aspect enables the approximate determination of the shelf-life of multiphase mixtures, for example drug products or drug substances, formulated in an aqueous medium, without the requirement of opening the vial or product container, without peeling off the label on the vial, without requiring any reagents for sample analysis, and/or without relying on visualization or the use or measurement of photons (e.g., light) or backscattered detection.

In a third aspect, the present invention relates to a method of determining the sedimentation volume ratio (SVR) of a multiphase mixture sample using wNMR, said method comprising:

inserting a vial comprising the multiphase mixture sample into a nuclear magnetic resonance (NMR) spectroscopy probe;

tracking supernatant of the multiphase mixture sample during sedimentation and determining a pre-exponential factor $I_o^S(T)$ at T=total time $T_{total}$ using biexponential fitting of a Carr-Purcell-Meiboom-Gill (CPMG) echo signal decay;

tracking sediment of the multiphase mixture sample during sedimentation and determining a pre-exponential factor $I_o^F(T)$ at T=total time $T_{total}$ using biexponential fitting of a CPMG echo signal decay; and calculating the $SVR^{NMR}$ of the multiphase mixture sample, wherein the $SVR^{NMR}$ is compared to an SVR control for a multiphase mixture ($SVR^{control}$), wherein a $SVR^{NMR}$ less than $SVR^{control}$ is indicative of higher density and compactness of sediment in the multiphase mixture sample relative to the control and wherein $SVR^{NMR}$ greater than $SVR^{control}$ is indicative of lower density and compactness of sediment in the multiphase mixture sample relative to the control.

The multiphase mixture sample of the third aspect has a known concentration and the $SVR^{NMR}$ measured to determine if the multiphase mixture sample is stable relative to a known, stable, efficacious multiphase mixture (i.e., a control) at substantially the same concentration. The method of the third aspect does not rely on visualization or the use or measurement of photons or backscattered detection. Further, the method of the third aspect is performed without introducing any additives to the multiphase mixture sample prior to measurement. The vial may be sealed because the multiphase mixture sample is ready for distribution, i.e., a drug product, and the measurement of exponential factors $I_o^S(T)$ and $I_o^F(T)$ is made in situ, or the multiphase mixture sample may be dispensed to a vial directly from the manufacturing process for determining the exponential factors $I_o^S(T)$ and $I_o^F(T)$ before, during, or at the conclusion of the manufacturing process, i.e., a drug substance. The $SVR^{NMR}$ of the third aspect can be calculated using the formula:

$$SVR^{NMR} = \frac{I_0^F(T)}{[I_0^F(T) + I_0^S(T)]} \text{ at } T = t_{total}$$

When the $SVR^{NMR}$ is less than $SVR^{control}$, it is generally acknowledged that there may be potential difficulties with resuspension of the sediment in the supernatant. As opposed to optical analyzers (e.g., ones requiring the use or measurement of photons, i.e., light) monitoring only the clarifying supernatant layer, wNMR is capable of simultaneously tracking the dynamics of supernatant and sediment formation in biphasic sedimenting suspensions. For the fully sedimented samples, wNMR provides an accurate and reliable estimate of SVR. The results evidence the potential applicability of wNMR as a tool to study a wide range of important suspensions, emulsions, and foams, either presented for measurement as a drug substance or a drug product, both for quality assurance and in order to improve their stability and efficacy.

In a fourth aspect, the present invention relates to a method of determining the clarification rate (CR) of supernatant and/or the densification rate (DR) of sediment in a multiphase mixture sample, said method comprising:
  inserting a vial comprising the multiphase mixture sample into a nuclear magnetic resonance (NMR) spectroscopy probe;
  tracking sedimentation of the multiphase mixture sample and determining a supernatant relaxation component $R_2^S(T)$ and a sediment relaxation component $R_2^F(T)$ of the multiphase mixture sample at time intervals T over a total time $T_{total}$;
  calculating (a) the multiphase mixture sample clarification rate ($CR_{sample}$), (b) the multiphase mixture sample densification rate ($DR_{sample}$), or (c) both (a) and (b); and
  at least one of (i) comparing the multiphase mixture sample $CR_{sample}$ to an approved control clarification rate ($CR_{cont}$) for the multiphase mixture, wherein if the multiphase mixture sample $CR_{sample}$ is less than an acceptable range of the approved $CR_{cont}$, the multiphase mixture sample is experienced hindered settling effects relative to an approved multiphase mixture and if the multiphase mixture sample $CR_{sample}$ is greater than an acceptable range of the approved $CR_{cont}$, the multiphase mixture sample is experienced enhanced settling effects relative to an approved multiphase mixture, (ii) comparing the multiphase mixture sample $DR_{sample}$ to an approved control densification rate ($DR_{cont}$) for the multiphase mixture, wherein if the multiphase mixture sample $DR_{sample}$ is greater than an acceptable range of the approved $DR_{cont}$, the particles in the multiphase mixture sample are larger than the particles in an approved multiphase mixture and vice versa, or (iii) both (i) and (ii).

If the settling effects are more hindered or enhanced relative to the control, the manufacturer may be able to modify the batch the sample originated from, as readily understood by the person skilled in the art, or the batch the sample originated from should not be distributed. Furthermore, with regard to the densification rate, it is generally known that particles in a sample that are smaller than the particles in a control, will undergo more compaction and will be more difficult to resuspend than particles in the control. If there are problems with resuspension, the concentration of drug substance per unit volume will be less than expected, with a concomitant reduction in efficacy because a patient is receiving less drug substance than thought.

With regard to clarification rate, the multiphase mixture sample of the fourth aspect has a known concentration and the $CR_{sample}$ measured to determine if the multiphase mixture sample experiences hindered or enhanced settling relative to a known, stable, efficacious multiphase mixture (i.e., a control) at substantially the same concentration. The method of the fourth aspect does not rely on visualization or the use or measurement of photons or backscattered detection. Further, the method of the fourth aspect is performed without introducing any additives to the multiphase mixture sample prior to measurement. The vial may be sealed because the multiphase mixture sample is ready for distribution, i.e., a drug product, and the measurement of $R_2^S(T)$ is made in situ, or the multiphase mixture sample may be dispensed to a vial directly from the manufacturing process for determining the $CR_{sample}$ before, during, or at the conclusion of the manufacturing process, i.e., a drug substance. The $CR_{sample}$ can be calculated in $h^{-1}$ by plotting the data and using the formula:

$$R_2^S(T) = R_2^S(0)\exp(-T \times CR_{sample}) + R_{2,0}^S$$

where $R_2^S(0)$ is a pre-exponential factor at T=0, $R_2^S(T) = R_2^S(0) + R_{2,0}^S$, $R_{2,0}^S$ is a baseline offset component equal to $R_2^S(T)$ at time T→∞. Time intervals T can be readily determined by the person skilled in the art, and can be equally spaced over total time $T_{total}$, or can be equally spaced immediately after the sedimentation rate experiment begins, with an increase in the length of the time intervals as sedimentation occurs. In other words, the time intervals over $T_{total}$ can be the same as or different from one another, as readily determined by the person skilled in the art. In one embodiment, the multiphase mixture comprises at least one drug substance. With regard to modification, if the multiphase mixture sample $CR_{sample}$ is outside of an acceptable range of the approved $CR_{cont}$ for the multiphase mixture, the manufacturer can check any of a number of characteristics of the multiphase mixture including, but not limited to, particle size distribution, the pH, the ionic strength, and particle concentration, and modify as necessary.

With regard to the densification rate, the multiphase mixture sample of the fourth aspect has a known concentration and the $DR_{sample}$ measured to determine if the particles of the multiphase mixture sample are larger than the particles of the control, as well as how compacted the sediment is, which provides information on how difficult or easy it will be to resuspend the particles in the multiphase mixture. The method of the fourth aspect does not rely on visualization or the use or measurement of photons or backscattered detection. Further, the method of the fourth aspect is performed without introducing any additives to the multiphase mixture sample prior to measurement. The vial may be sealed because the multiphase mixture sample is ready for distribution, i.e., a drug product, and the measurement of $R_2^F(T)$ is made in situ, or the multiphase mixture sample may be dispensed to a vial directly from the manufacturing process for determining the $DR_{sample}$ before, during, or at the conclusion of the manufacturing process, i.e., a drug substance. The $DR_{sample}$ can be calculated in $h^{-1}$ by plotting the data and using the formula:

$$R_2^F(T) = R_2^F(\infty)[1 - \exp(-T \times DR_{sample})] + R_2^F(0)$$

where $R_2^F(\infty)$ is a pre-exponential factor at T→∞, $R_2^F(T) = R_2^F(\infty) + R_2^F(0)$, where $R_2^F(0)$ is a baseline offset component equal to $R_2^F(T)$ at time T=0. The time intervals T can be readily determined by the person skilled in the art, and can be equally spaced over total time $T_{total}$, or can be equally spaced immediately after the sedimentation rate experiment begins, with an increase in the length of the time intervals as sedimentation occurs. In other words, the time intervals over $T_{total}$ can be the same as or different from one another, as readily determined by the person skilled in the art. In one embodiment, the multiphase mixture comprises at least one drug substance. With regard to modification, if the multiphase mixture sample $DR_{sample}$ is outside of an acceptable range of the approved $DR_{cont}$ for the multiphase mixture, the manufacturer can check any of a number of characteristics of the multiphase mixture including, but not limited to, particle size distribution, the pH, the ionic strength, and particle concentration, and modify as necessary.

The method of the fourth aspect enables the assessment of the stability and quality of multiphase mixtures, for example drug products or drug substances, formulated in an aqueous medium, without the requirement of opening the vial or product container, without peeling off the label on the vial, without requiring any reagents for sample analysis, and/or without relying on visualization or the use or measurement of photons (e.g., light) and backscattered detection. The method can be quantitative and comprises measuring the $R_2^S(T)$ and $R_2^F(T)$ as a quality control and quality assurance parameter. Manufacturers and quality control regulators can readily use the method of the fourth aspect to determine if a multiphase mixture sample is stable and thus efficacious.

It should be appreciated that the methods described herein can be based on the water proton longitudinal relaxation rate $R_1(^1H_2O, T)$, instead of the rate $R_2(^1H_2O, T)$, as readily determined by the person skilled in the art.

Advantages of the methods described herein, which can use low field solvent NMR, includes, but is not limited to, low cost instrumentation (e.g., a desktop NMR), simple and rapid data acquisition and analysis, and minimal technical expertise requirement whereby the results are readily available within <1 min. Moreover, the methods described herein do not rely on human visualization or photons (i.e., light), which are subject to error and loss of resolution. In addition, the analysis described herein can be performed without any optical sensors or optical detectors, which are designed to move along the length of a sample tube in apparatuses and methods of prior art. Not only is less sample volume needed to use the wNMR methods described herein, but concerns associated with the use of light spectroscopy are eliminated. The method described herein can utilize high field NMR, if needed. In one embodiment, no additives or other species are added to the multiphase mixtures prior to analysis as described herein.

Further, the two-component, biexponential approach associated with the use of wNMR permits the user to obtain data on the sediment, its compaction dynamics, and sedimentation volume ratio, which has not available using the apparatuses and methods of the prior art.

Disadvantageously, the methods of the prior art are all ex situ techniques, wherein the sedimentation behavior of a pharmaceutical suspension is monitored by transferring the suspension to a tube specific for each technique. With regard to the analysis of a drug product using the methods described herein, the methods can be non-invasive, i.e., in situ, wherein the vial that the drug substance has been dispensed into can be introduced directly to an NMR probe, without peeling off the label, without being concerned about the opaqueness (or lack thereof) of the multiphase mixture contained therein, and without the requirement of using a specific analysis vial that is unique to the instrument. Another advantage of an in situ technique, which is only possible using the methods described herein, is that the drug product can still be distributed and used. At the drug substance (DS) level, in situ measurement is less critical.

Any and/or all of the method steps described herein may be embodied in computer-executable instructions stored on a computer-readable medium, such as a non-transitory and/or tangible computer readable medium and/or a computer readable storage medium. Additionally, or alternatively, any and/or all of the method steps described herein may be embodied in computer-readable program instructions stored in the memory and/or other non-transitory and/or tangible storage medium of a computing device that includes one or more processors, such that the computing device is caused to perform such method steps when the one or more processors execute the computer-readable instructions. The necessary calculations and control data can be stored on the computer-readable medium, and the results generated thereon, wherein the user can quickly and easily understand the results.

The features and advantages of the invention are more fully shown by the illustrative examples discussed below.

Example

General Description

The present inventors used wNMR to monitor the sedimentation process of ALHYDROGEL and ADJU-PHOS at different adjuvant concentrations in real time. ALHYDROGEL is the commercial name for aluminum hydroxide gel, which is positively charged at neutral pH; ADJU-PHOS is the commercial name for aluminum phosphate gel, which is negatively charged at neutral pH. ALHYDROGEL and ADJU-PHOS are two commonly used vaccine adjuvants, appearing in more than ten licensed vaccines, including ENGERIX B (ALHYDROGEL) and DAPTACEL (ADJU-PHOS).

Sealed vials of aluminum adjuvant suspension were kept inside the probe of a benchtop NMR instrument for one week, and the value of $R_2(T)$ was periodically measured. As opposed to optical analyzers monitoring only the clarifying supernatant layer, wNMR has shown the capability to track simultaneously the dynamics of supernatant and sediment formation in biphasic sedimenting suspensions. For the fully sedimented samples, wNMR provides an accurate and reliable estimate of SVR. In contrast to other analytical techniques, wNMR provides all above-mentioned valuable information without having to open the sealed vial, even if a user cannot visually observe the phase separation interface, e.g., in an opaque and/or labeled vial. The results evidence the potential applicability of wNMR as a tool to study a wide range of important suspensions, emulsions, and foams, both for quality assurance and in order to improve their stability and efficacy.

Materials and Sample Preparation

Two aluminum vaccine adjuvants—aluminum hydroxide gel (ALHYDROGEL, [Al(III)] 10 mg/mL) and aluminum phosphate gel (ADJU-PHOS, [Al(III)] 5 mg/mL (Brenntag Biosector S/A (Denmark))—were used.

Initial suspensions of both adjuvants were diluted with pure water (18.2 MOhm) to form a series with Al(III) concentrations of 5.0 mg/mL, 2.0 mg/mL, 1.0 mg/mL, and 0.5 mg/mL. About 4 mL of each diluted sample were aliquoted into glass vials; these vials emulate typical vaccine vials and there are no special requirements of their optical transparency or thickness. The vials were then sealed with rubber stoppers and secured with aluminum metal caps (FIGS. 1(a)-1(b)). The average heights of the suspensions in the filled vials were 29 mm (all ALHYDROGEL vials) and 26 mm (all ADJU-PHOS vials). Prior to measurements all samples were stored at 4° C.

To calculate the volume fraction (in %) of the aluminum adjuvant in each suspension sample, [Al(III)] mass concentration values were converted to corresponding mass concentrations of aluminum hydroxide gel (for ALHYDROGEL) and aluminum phosphate gel (ADJU-PHOS) using the conversion ratio: 1 mg/mL [Al(III)]=2.89 mg/mL ALHYDROGEL=4.53 mg/mL ADJU-PHOS (Vecchi, S, et al., 2012). The volume fraction of each adjuvant at any given concentration was derived using the tabulated data on the corresponding densities—2.42 g/cm³ for aluminum hydroxide solid powder, and 2.57 g/cm³ for aluminum phosphate solid powder (CRC, 2014). The results of the calculations are shown in Table 1 below.

TABLE 1

Volume fractions of ALHYDROGEL and ADJU-PHOS corresponding to different [Al(III)] concentrations

| [Al(III)], mg/mL | ALHYDROGEL Volume Fraction, % | ADJU-PHOS Volume Fraction, % |
|---|---|---|
| 0.5 | 0.06 | 0.09 |
| 1.0 | 0.12 | 0.17 |
| 2.0 | 0.24 | 0.34 |
| 5.0 | 0.61 | 0.87 |

Monitoring and Calculations

Measurements of the water proton transverse relaxation rate over time during the sedimentation process of both adjuvants at different Al(III) concentrations were performed using a low-field time-domain benchtop NMR instrument MQC+ (Oxford Instruments plc, UK) at 0.56 T, $^1$H resonance frequency 23.8 MHz, and with a wide bore probe (i.d. 26 mm). The temperature of the magnet was 25° C. (±0.01° C.). The instrument was installed in a room thermostated at 18° C. (±0.5° C.) to ensure the stability of its permanent magnet.

Figure 1B:
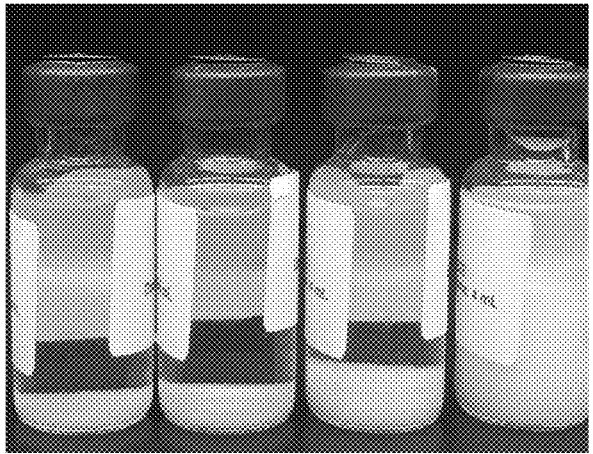
FIG. 1(b) illustrates samples of ADJU-PHOS after 168 h of sedimentation. Adjuvant concentration is [Al(III)] 0.5 mg/mL, 1.0 mg/mL, 2.0 mg/mL, 5.0 mg/mL (from left to right).
Figure 1C:
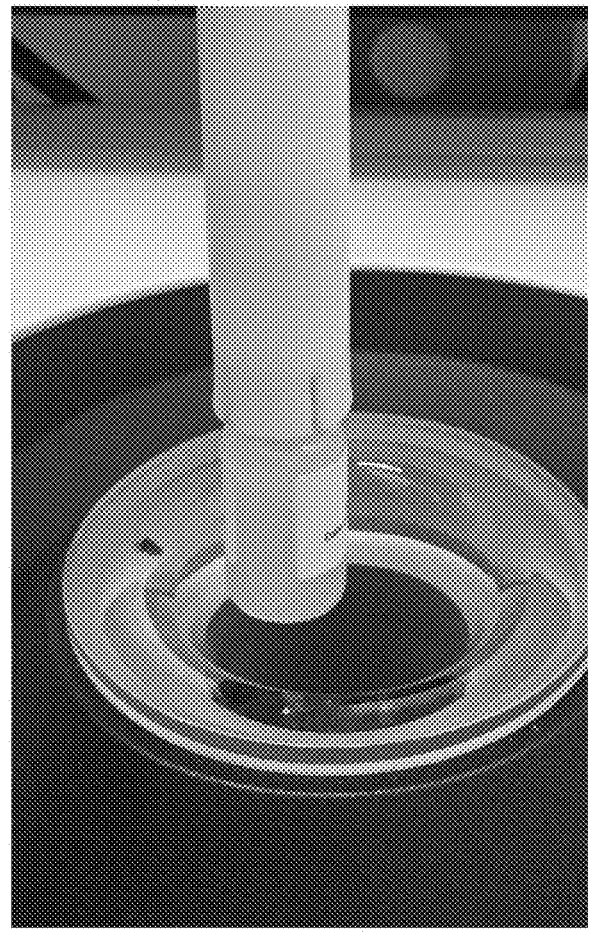
FIG. 1(c) illustrates an adjuvant in a sealed vial gripped by a PTFE sample holder and lowered into the probe of benchtop NMR.
Figure 3A:
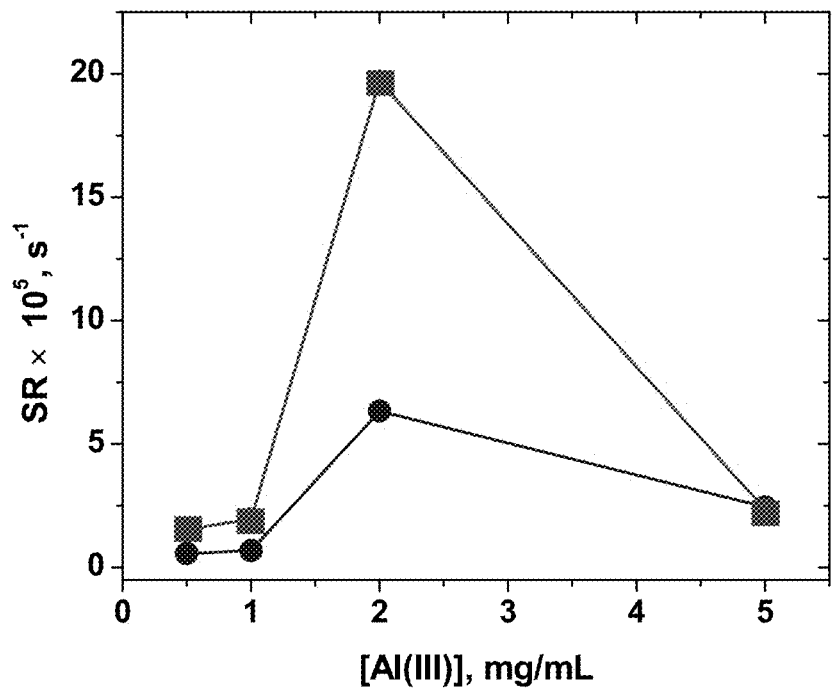
FIG. 3(a) illustrates the dependences of sedimentation rate (SR) on Al(III) concentration for both aluminum adjuvants. (✱) ALHYDROGEL; (✻) ADJU-PHOS.
Figure 3B:
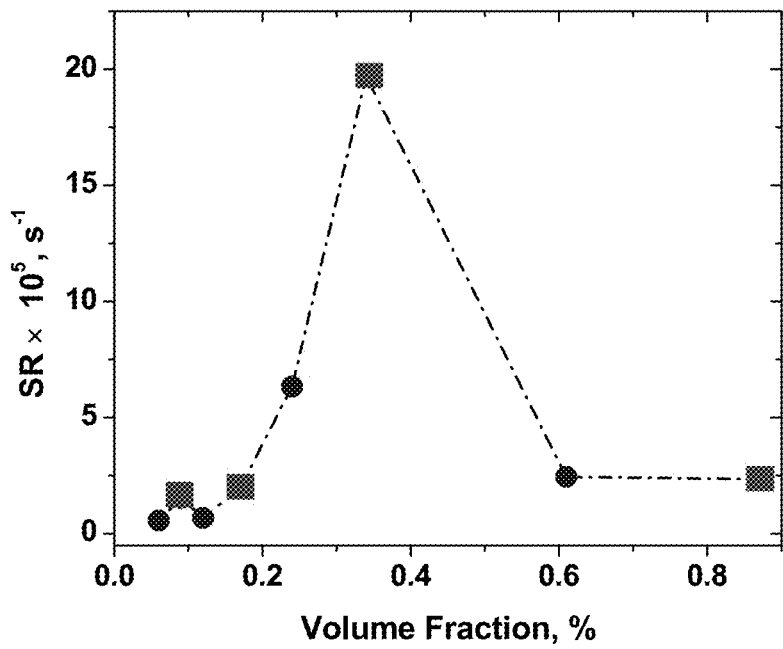
FIG. 3(b) illustrates the dependences of sedimentation rate (SR) on the volume fraction, combined data for both adjuvants. (✱) ALHYDROGEL; (✻) ADJU-PHOS.

The sealed sample vial was gripped by a PTFE sample holder (FIG. 1(c)) which was loaded into the probe of benchtop NMR instrument (Taraban, M. B., et al., Am. Pharm. Rev., 2019). After 40 min of thermal equilibration to the probe temperature of 25° C., the sealed sample vial was quickly pulled out of the NMR probe and vigorously shaken to ensure full and uniform suspension of the aluminum adjuvant particles. After shaking, the sealed sample vial was quickly lowered back into the NMR probe, followed by the immediate start of relaxation measurements. The sedimentation process was monitored for one week (168 h), and data were taken every 0.5-1 h during the first day of monitoring, and every 2-3 h during the following days of monitoring, excluding the night hours.

The standard Carr-Purcell-Meiboom-Gill (CPMG) pulse sequence (Meiboom, S., et al., 1958) was used to measure the water proton transverse relaxation rate $R_2(T)$ at different time points T of the sedimentation process (0≤T≤168 h). For calibration of the 90°- and 180°-pulses, a sealed and degassed mineral oil sample was used which due to its fast relaxation allows one to rapidly scan a wide range of radiofrequency pulse values and to select correct duration of 90°- and 180°-pulses. The interpulse delay 2π between 180°-pulses was 600 μs, and for each sedimentation time point, echo signal decay was acquired and averaged over two accumulation scans. Successive accumulation scans were separated by 15 s relaxation delay; 2,000-6,000 (for fully suspended samples depending on the concentration) to 20,000 (for all settling samples during the sedimentation monitoring) echoes were collected for each scan. At each time point of the sedimentation process, data collection was repeated three times in consecutive measurements. The duration of all three consecutive measurements is ca. 3 minutes, and the resulting data were assigned to the time-point corresponding to the completion of the third measurement. The resulting time-dependent decays of the echo signal intensity were used to derive the values of water proton transverse relaxation rate $R_2(T)$ as well as other relaxation parameters detailed below.

Equation (1) was used to extract the water proton transverse relaxation rate $R_2(T)$ from single-exponential fit of the CPMG echo signal decay data obtained at time T of the sedimentation process $$I(t)=I_0 \exp[-t \times R_2(T)] \quad (1)$$

where I(t) is the observed decay of echo signal intensity over echo decay time t (0≤t≤12 s), $I_0$ is the initial echo signal intensity at t=0.

To obtain sedimentation rate (SR), data sets of $R_2(T)$ vs. sedimentation time T (0≤T≤168 h) for each adjuvant at different concentrations were fit with Equation (2):

$$R_2(T)=R_2^0 \exp(-T \times SR)+R_{2,0} \quad (2)$$

where $R_2^0$ is a pre-exponential factor at T=0, $R_2(T)=R_2^0+R_{2,0}$, wherein $R_{2,0}$ is a baseline offset component equal to $R_2(T)$ at time T→∞, and SR is the sedimentation rate of an adjuvant suspension at a given concentration in $h^{-1}$. Notably, the units of sedimentation rates depend on technique used to monitor the sedimentation process. In the present case, the unit of SR ($h^{-1}$) characterizes the rate of $R_2(T)$ decrease as sedimentation progresses.

The biexponential fitting of the CPMG echo signal decay at time T of the sedimentation process for both adjuvants at [Al(III)] 5.0 mg/mL employed Equation (3):

$$I(t)=I_0^S(T)\exp[-t \times R_2^S(T)]+I_0^F(T)\exp[-t \times R_2^F(T)] \quad (3)$$

where I(t) is the observed echo signal intensity over the echo decay time t (0≤t≤12 s), $I_0^S(T)$ is the pre-exponential factor (echo signal intensity at t=0) of the slow relaxing component rate constant $R_2^S(T)$ attributed to the supernatant layer (dearth of Al(III)), $I_0^F(T)$ is the pre-exponential factor (echo signal intensity at t=0) of the fast relaxing component with rate constant $R_2^F(T)$ attributed to the sediment layer (rich in Al(III)). This two-component, biexponential approach, in contrast to optical sedimentation monitoring techniques which only tracks the supernatant, allows one to track simultaneously the changes in supernatant and sediment. Of note, both parameters of the slow component—$I_0^S(T)$ and $R_2^S(T)$—and those of the fast component—$I_0^F(T)$ and $R_2^F(T)$—change over the sedimentation time T, as they monitor the evolution of the supernatant and sediment layers, respectively. Biexponential decay of the echo signal intensity becomes apparent after 2 h of sedimentation, hence the experimental data fitted by the Equation 3 are in the range 2 h≤T≤168 h.

During sedimentation, the concentration of Al(III) in the supernatant layer is gradually dropping, and as it has been shown earlier (Taraban, M. B., et al., Am. Pharm. Rev., 2019), such concentration drop is reflected in the steady decline of the slow relaxation component $R_2^S(T)$. At the same time, increasing height of the slower relaxing supernatant layer results in the growth of its contribution, $I_0^S(T)$. In parallel, the concentration of Al(III) in the sediment layer is gradually growing, and therefore, the fast relaxation component $R_{2F}(T)$ consistently grows, reflecting such concentration increase (Id.). Concomitantly, the compaction of the faster relaxing sediment layer is characterized by the decrease of its contribution, $I_0^F(T)$. As the sedimentation progresses, the widening of supernatant layer results in a decrease of the slow component $R_2^S(T)$ (i.e., the slow component becomes slower because its adjuvant concentration keeps decreasing). The decrease rate (in $h^{-1}$) of this component is called the clarification rate (CR) of the supernatant layer. Likewise, the compaction of the sediment layer on the bottom leads to increase of the fast component $R_2^F(T)$ (i.e., the fast component becomes faster because its adjuvant concentration keeps increasing). The growth rate (in $h^{-1}$) of this component is called densification rate (DR) of the sediment layer.

To obtain the values of CR describing the rate of supernatant clarification, data sets of the slow relaxation component $R_2^S(T)$ vs. the sedimentation time T (2 h≤T≤168 h) for each adjuvant suspension at 5 mg/mL Al(III) concentration were fit using Equation (4):

$$R_2^S(T)=R_2^S(0)\exp(-T\times CR)+R_{2,0}^S \quad (4)$$

where $R_2^S(0)$ is a pre-exponential factor at T=0, $R_2^S(T)=R_2^S(0)+R_{2,0}^S$, $R_{2,0}^S$ is a baseline offset component equal to $R_2^S(T)$ at time T→∞, and CR is the clarification rate of an adjuvant at [Al(III)] 5.0 mg/mL in unit of $h^{-1}$.

To obtain the values of DR describing the rate of sediment densification, data sets of the fast relaxation component $R_2^F(T)$ vs. the sedimentation time T(2 h≤T≤168 h) for each adjuvant suspension at 5 mg/mL Al(III) concentration were fit using equation (5):

$$R_2^F(T)=R_2^F(\infty)[1-\exp(-T\times DR)]+R_2^F(0) \quad (5)$$

where $R_2^F(\infty)$ is a pre-exponential factor at T→∞, $R_2^F(T)=R_2^F(\infty)+R_2^F(0)$, $R_2^F(0)$ is a baseline offset component equal to $R_2^F(T)$ at time T=0, and DR is the densification rate of an adjuvant at [Al(III)] 5.0 mg/mL in unit of $h^{-1}$.

As it has been already mentioned, during sedimentation, the time courses of relaxation rates of the slow, $R_2^S(T)$, and the fast, $R_2^F(T)$, components in the biexponential model of Equation 3 reflect changes in the Al(III) concentration in supernatant and sediment, respectively. Further, the corresponding pre-exponentials of slow, $I_0^S(T)$, and fast, $I_0^F(T)$, components are proportional to the corresponding intensities of the echo signals and, in turn, reflect the changing relative volumes of supernatant and sediment layers, respectively. Therefore, their changes over the sedimentation time allow one to estimate the volume and/or the height of each component inside the vial. Of note, for simplicity, the values of $I_0^S(T)$ and $I_0^F(T)$ were normalized, so $I_0^S(T)+I_0^F(T)=1$ at any sedimentation time point T.

All data processing was performed using Origin 8.1 software (OriginLab Corp., Northampton, Mass.).

After the completion of the monitoring of sedimentation process (168 h), the sedimentation volume ratio (SVR) in the sedimented samples (FIGS. 1(a)-1(b)) was measured using an electronic caliper. First, the height of the sediment ($h_{sed}$) at the bottom of each vial was measured three times, and the average value was recorded. Next, the vial was vigorously shaken to ensure full and uniform suspension of the aluminum adjuvant particles, and the average heights of the suspensions ($h_{susp}$, 29 mm for all ALHYDROGEL vials and 26 mm for all ADJU-PHOS vials) in each vial was measured three times, and the average value was recorded. Sedimentation volume ratio from visual caliper measurements ($SVR^{VIS}$) was calculated using Equation (6):

$$SVR^{VIS} = \frac{h_{sed}}{h_{susp}} \quad (6)$$

To compare $SVR^{VIS}$ from caliper measurement with the sedimentation volume ratio from wNMR measurements ($SVR^{NMR}$), the CPMG echo signal decay data for all concentrations of both adjuvants studied in this work at the end of sedimentation (T=168 h) were fitted using the biexponential function shown in Equation 3. Values of the fast pre-exponential factor $I_0^F(T)$ at T=168 h, defining the quantitative contribution of the sediment to the total echo signal intensity, and the slow pre-exponential factor $I_0^S(T)$ at T=168 h, defining the quantitative contribution of the supernatant to the total echo signal intensity, were used to calculate $SVR^{NMR}$ as a fraction of the fast component contribution to the total using Equation (7):

$$SVR^{NMR}=I_0^F(T)/[I_0^F(T)+I_0^S(T)] \text{ at } T=168h \quad (7)$$

Results and Discussion—Monitoring Sedimentation

Monitoring of the sedimentation process for two aluminum adjuvants clearly demonstrated the sensitivity of the water proton transverse relaxation rate $R_2(T)$ towards sedimentation kinetics. As seen from FIGS. 2(a)-2(b), in both ALHYDROGEL and ADJU-PHOS suspensions, $R_2(T)$ derived from the single-exponential fit of the CPMG echo signal decay, demonstrated steady decrease over the time course of the sedimentation process. Clearly, during sedimentation, the drop in the observed value of $R_2(T)$, to an increasingly greater extent, is due to the formation of a clarifying layer (supernatant). As the sedimentation progresses, the supernatant becomes increasingly free from aluminum particles, and its $R_2(T)$ approaches the one observed for pure water which under current measurement settings, is ~0.37-0.40 $s^{-1}$. Sedimentation rate (SR) values extracted from the sedimentation kinetic traces in FIGS. 2(a)-2(b) show evident dependence on the Al(III) concentration in both adjuvants. Expectedly, in both cases, faster sedimentation is observed with increasing adjuvant concentration, up to [Al(III)] of 2.0 mg/mL.

It is also evident from FIGS. 2(a)-2(b), that ALHYDROGEL has consistently slower sedimentation rates compared to ADJU-PHOS within the range of [Al(III)] from 0.5 to 2.0 mg/mL. Most vivid is the difference observed at [Al(III)] 2.0 mg/mL, where based on the SR values, the sedimentation rate of ADJU-PHOS is ~3 times faster than that of ALHYDROGEL (0.710 $h^{-1}$ vs. 0.228 $h^{-1}$). The most probable reason for these observations is the difference in the average particle size of the two adjuvants. It has been shown (Shardlow, E., et al., 2017) that the median particle sizes in undiluted adjuvants ([Al(III)] 5.0 mg/mL ADJU-PHOS, and 10.1 mg/mL for ALHYDROGEL) demonstrate more than 2.5-fold difference, with ADJU-PHOS (~7.2 μm) being significantly larger compared to ALHYDROGEL (~2.7 μm). After dilution to [Al(III)] 1.0 mg/mL, which is believed to decrease potential particle coalescence, the difference is still significant, and the mean particle size of ADJU-PHOS is still larger than that of ALHYDROGEL, ~2.1 μm vs. ~1.2 μm, respectively (Id.). Therefore, one might reasonably suggest that the larger particle size of ADJU-PHOS is the one of important factors contributing to its generally faster sedimentation rates compared to ALHYDROGEL.

In addition to the particle size difference, the concentration dependence of the sedimentation rates for both adjuvants could be related to the changes in the particle surface charges when diluted from 5.0 mg/mL to 0.5 mg/mL. Measurements of the zeta-potential (Id.) have shown that dilution of ALHYDROGEL results in the increase of its absolute surface charge (from about +11 mV to about +14 mV), and the absolute surface charge of ADJU-PHOS also significantly increases (from about |−23| mV to about |−38| mV). In both cases, dilution moves the pH of both adjuvant suspensions further away from their respective point-of-zero charge (PZC) value, 8.4 for ALHYDROGEL and 5.2 for ADJU-PHOS (Salnikova, M. S., et al., 2012). This means that for both adjuvants, the particles become more charged upon dilution, which leads to stronger inter-particle repulsion. Such increasing in the absolute particle charges has been shown to slow down the flocculation and settling for both adjuvants due to more significant inter-particle repulsion at lower concentrations (Id.). Thus, the observed growth of the sedimentation rate vs. concentration for both adjuvants (FIGS. 2(a)-2(b), FIGS. 3(a)-3(b) is additionally facilitated by the greater interparticle attraction due to their lower surface charge at higher concentrations.

Note, that the sedimentation rate of both adjuvants demonstrated a significant drop after [Al(III)] increases from 2.0 mg/mL to 5.0 mg/mL (FIGS. 2(a)-2(b), FIGS. 3(a)-3(b)), with ADJU-PHOS dropping to a much greater extent (88% reduction, from 0.710 $h^{-1}$ to 0.084 $h^{-1}$) than ALHYDROGEL (39% reduction, from 0.228 $h^{-1}$ to 0.088 $h^{-1}$).

In general, this observation could be attributed to the well-known hindered settling effect, which, without being bound by theory, is believed to be the deviation of the settling velocity from the Stokes' law at higher volume fractions of the settling particles. Briefly, in accordance with the Stokes' law, the terminal settling velocity vs of a particle is defined by the balance between gravity, fluid buoyance and fluid drag force and could be derived from Equation (8):

$$v_s = \frac{D^2(\rho_p - \rho_f)g}{18\eta} \quad (8)$$

where D is the particle diameter, $\rho_P$ is the particle density, $\rho_f$ is the solvent density, $\eta$ is the solvent viscosity, and g is the acceleration of gravity. It is also known that at low particle concentrations/volume fractions, the settling velocity will increase with growing particle concentration (Barfod, N., 1972). Indeed, even though Equation 8 describes the settling velocity in terms of an individual particle, it still could be used to explain the increase of vs with particle concentration. Briefly, several model studies (Jovanovic, D. S., 1965; Jayaweera, K. O., et al., 1964) considered the concentration dependence of vs from the viewpoint of the formation of particle clusters which settle faster than individual particles since their effective size D is larger. Evidently, the formation of such particle clusters becomes more probable as the particle concentration grows. Such particle clustering has been experimentally observed for both adjuvants-median particle size and polydispersity index both grow at higher concentrations (Shardlow, E., et al., 2017). Of note, such increasing trend of sedimentation rate vs. concentration is in fair agreement with our observations for both adjuvants in the range of [Al(III)] from 0.5 to 2.0 mg/mL (FIGS. 2(a)-2(b)). However, when the concentration of particles (volume fraction) reaches a certain threshold, inter-particle interactions (now dominated by repulsions), higher effective viscosity of the fluid, upward fluid flow opposite to sedimenting particles due to increasing number of falling particles, create an additional drag force that slows down the settling velocity (Davies, R., 1968). Under these conditions, the settling velocity is defined using Equation (9) (Dey, S., et al., 2019):

$$v_{hs} = v_s(1-C)^Z \quad (9)$$

where $v_{hs}$ is the hindered settling velocity, C is concentration of a sediment (volume fraction), and Z is the hindered settling exponent empirically dependent of the particle Reynolds number, $\mathcal{R}$. Numerous experimental observations show that under a variety of conditions, the value of Z is within the range from 2.5 to 6.0 depending on the particle nature, shape, interactions and Reynolds number $\mathcal{R}$ (Baldock, T. E., et al., 2004). In sum, Equation 8 suggests the increase of settling velocity with growing particle concentration, however once a certain concentration value is reached, the settling velocity will follow Equation 9 and decrease with growing particle concentration.

It follows from Equation 9 that under the hindered settling condition, the increase in particle concentration/volume fraction C results in a drop of the particle settling velocity. Indeed, for aluminum oxide, it has been shown that at low volume fractions, from about 0.005 vol. % to about 0.2 vol. %, sedimentation rate steadily increases with particle concentration, reaching the maximum in the range from about 0.2 vol. % to about 0.3 vol. % (Barfod, N., 1972). However, after about 0.4 vol. %, hindered fluid drag forces lead to the drop in sedimentation rates (Id.). In the present case, for both aluminum adjuvants, the range of expected maximum settling velocity falls exactly around [Al(III)] 2.0 mg/mL, which corresponds to 0.24 vol. % and 0.34 vol. % for ALHYDROGEL and ADJU-PHOS, respectively (see, Table 1). At [Al(III)] 5.0 mg/mL, where the drop of sedimentation rate was observed by wNMR, is already in the volume fraction range (0.61 vol. % and 0.87 vol. % for ALHYDROGEL and ADJU-PHOS, respectively) where the decrease in sedimentation rate was experimentally observed by other techniques (Id.).

The above mentioned difference in the volume fractions of ALHYDROGEL and ADJU-PHOS at [Al(III)] 5.0 mg/mL might also help to explain their very close values of sedimentation rate (FIGS. 2(a)-2(b)). Indeed, at [Al(III)] 5.0 mg/mL, the average particle size of ADJU-PHOS is larger (Shardlow, E., et al., 2017), and the inter-particle electrostatic repulsion is weaker due to smaller difference between pH and PZC values (data not shown). Therefore, one might expect that at this concentration, ADJU-PHOS would sediment faster compared to ALHYDROGEL. However, the noticeably larger volume fraction of ADJU-PHOS (0.87% for ADJU-PHOS vs. 0.61% for ALHYDROGEL, Table 1) could possibly aggravate the hindered settling effect which would slow down the sedimentation rate of ADJU-PHOS and bring it closer to that of ALHYDROGEL.

The results in this section demonstrate the advantage of $R_2(T)$ as a noninvasive tool which allows one to monitor sedimentation process of aluminum adjuvants within a wide range of [Al(III)] concentrations (volume fractions). Moreover, $R_2(T)$ is not only capable of providing consistent and reliable sedimentation rate estimates but is also sensitive to the onset of hindered settling conditions at high particle volume fractions. Importantly, real-time monitoring can be performed in an in situ manner on drug products. Alternatively, real-time monitoring can be performed on the drug substance during or subsequent to manufacture and prior to dispensing into a vial or other sealed container.

Results and Discussion—Biexponential Analysis

Monitoring of the adjuvants sedimentation process using wNMR also reveals another important capability of $R_2(T)$—separate and simultaneous sensitivity to the formation of a clarified layer (supernatant) and a densified layer (sediment) in the sample. As the sedimentation progresses, the CPMG echo signal decay, especially at high concentrations, started to demonstrate clear biexponential behavior, apparently defined by two components—slow and fast decay. Of note, the contributions from two exponential components became detectable after 2 hours of sedimentation monitoring (T=2 h). As introduced hereinabove, these two components reflect the respective contributions of the clarifying supernatant layer and the densifying sediment layer.

Biexponential fitting of the echo signal decay using Equation 3 allows us to obtain two water proton transverse relaxation rates at various time points of the sedimentation process—slow $R_2^S(T)$, and fast $R_2^F(T)$—respectively attributable to supernatant buildup and to sediment compaction. As one might expect, during sedimentation, the buildup of a supernatant should result in a gradual decrease of corresponding $R_2^S(T)$ values over time, since the settling of adjuvant particles draws the relaxation parameter of the clarifying layer closer and closer to that of water. At the same time, the densification of the settling sediment layer should lead to steady growth of the corresponding $R_2^F(T)$ values over time, since settling increases the effective concentration of an adjuvant in the sediment layer which is known to increase the water proton transverse relaxation rate (Taraban, M. B., et al., Am. Pharm. Rev., 2019). Indeed, as seen from FIGS. 4(a)-4(b), similar to the single-exponential data analysis discussed above (FIGS. 2(a)-2(b)), the water relaxation rate of the slow component $R_2^S(T)$ shows gradual decrease over time consistent with the clarification of the supernatant layer as the sedimentation progresses, while the water relaxation rate of the fast component $R_2^F(T)$ demonstrates steady and even sharp growth during settling, consistent with the densification of the sediment layer.

As seen in FIGS. 4(a)-4(b), the separation of two components of the sedimentation process, and monitoring their changes over time allows us to obtain the clarification rate (CR) describing the formation of the supernatant layer as well as the densification rate (DR) defining the buildup of the sediment layer and its compaction. The reliable separation of two components of biexponential echo decay appears to be possible only for the highest concentration of both ALHYDROGEL and ADJU-PHOS studied, [Al(III)] 5.0 mg/mL, where biexponential behavior of the echo decay signal emerges when T=2 h.

The clarification rate (CR) of ALHYDROGEL is twice that of ADJU-PHOS (0.484 h$^{-1}$ vs. 0.274 h$^{-1}$, FIG. 2). At [Al(III)] 5.0 mg/mL the volume fraction of ALHYDROGEL is smaller than ADJU-PHOS (0.61% vs. 0.87%), hence, in accordance with the above reasoning, ADJU-PHOS should be more affected by the hindered settling effects (Barfod, N., 1972), resulting in smaller CR.

On the other hand, the observed densification rate (DR) of ADJU-PHOS is nine times that of ALHYDROGEL (0.455 h$^{-1}$ vs. 0.050 h$^{-1}$). It is thought that one of the factors contributing to this difference is significantly larger median particle size in undiluted solutions than the one observed for ALHYDROGEL (~7.2 µm for ADJU-PHOS vs. ~2.7 µm for ALHYDROGEL) (Shardlow, E., et al., 2017). It has been shown that for both adjuvants that the water proton relaxation rate is linearly dependent on the [Al(III)] concentration (Taraban, M., et al., Am. Pharm. Rev., 2019). Importantly, the slope of such linear dependence, which reflects the sensitivity to concentration changes, is much larger for ADJU-PHOS compared to ALHYDROGEL (1.70 s$^{-1}$mg$^{-1}$mL vs. 1.06 s$^{-1}$mg$^{-1}$mL) (Id.). Since the settling essentially results in the increase of effective concentration of an adjuvant in sediment, another factor contributing to the observed difference in densification rates (DR) could be higher sensitivity of water relaxation rate to the changes in [Al(III)] concentration in ADJU-PHOS compared to ALHYDROGEL. Further, as introduced hereinabove, ALHYDROGEL particles have greater surface charge due to larger difference between pH and PZC values at [Al(III)] 5.0 mg/mL (2.33 for ALHYDROGEL vs. 1.1 for ADJU-PHOS). This leads to their higher repulsion at closer proximity in the sediment layer thus slowing down the densification rate compared to ADJU-PHOS.

The well-defined separation of fast and slow components of biexponential echo decay at [Al(III)] 5.0 mg/mL also makes it possible to monitor separately and simultaneously the changes in contributions of the respective slow and fast relaxation components, $I_0^S(T)$ and $I_0^F(T)$, over the sedimentation time T. As it was already noted above, these two pre-exponential factors reflect the growing volume of supernatant (slow, $I_0^S(T)$) and the decreasing volume of sediment (fast, $I_0^F(T)$). As seen from FIGS. 5(a)-5(b), monitoring of $I_0^S(T)$ and $I_0^F(T)$ vs. the sedimentation time T allows one to correlate the results of wNMR with other techniques used to estimate the settling velocity vs in length per time units, such as Wintrobe tube (Farrell, C., 2014) and/or optical scanning analyzers (Langford, A., et al., 2020). For example, at T=24 hours sedimentation time point-conventionally used for Wintrobe tube measurements—the contributions from supernatant layer ($I_0^S(T)$) constitute 0.34 and 0.12 for ALHYDROGEL and ADJU-PHOS, respectively (FIGS. 5(a)-5(b)). Based on these observations, one might obtain the 24-h average settling velocity vs in length per time units for both adjuvants at [Al(III)] 5.0 mg/mL using Equation 10:

$$v_s = I_0^S(T) \times h_{susp}/T \text{ at } T=24h \tag{10}$$

where $I_0^S(T)$ is the contribution from supernatant layer at sedimentation time point T, and $h_{susp}$ is the initial height of the suspension in a vial; 29 mm for ALHYDROGEL and 26 mm for ADJU-PHOS. As follows from FIGS. 5(a)-5(b) and Equation 10, at T=24 h, the average settling velocities vs of ALHYDROGEL and ADJU-PHOS will be equal to 0.41 mm/h and 0.13 mm/h, respectively. Of note, faster vs values for ALHYDROGEL compared to ADJU-PHOS are also consistent with the difference in their clarification rates (CR) shown in FIGS. 4(a)-4(b).

Figure 5A:
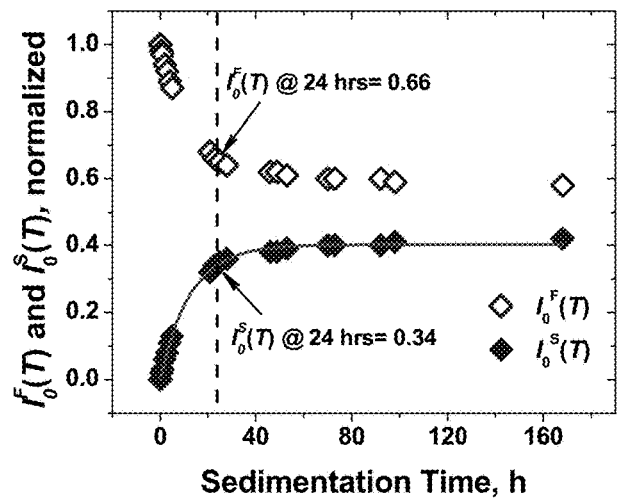
FIG. 5(a) illustrates the monitoring of the contributions from supernatant (slow, $I_0^S(T)$) and sediment (fast, $I_0^F(T)$) to the observed relaxation rate over sedimentation time for ALHYDROGEL at [Al(III)] 5.0 mg/mL. $I_0^S(T)$ and $I_0^F(T)$ are normalized such that $I_0^S(T)+I_0^F(T)=1$ for all T. Dashed vertical lines denote the sedimentation time point 24 h to calculate the 24-h average settling velocities $v_s$ in length per time units. Solid lines show corresponding single exponential growth fits of the data used to extract supernatant volume rate (SV)=0.08 $h^{-1}$. Data shown are the arithmetic means of three consecutive measurements, standard deviation in all cases is ±0.01 arb. unit (not shown for clarity).
Figure 5B:
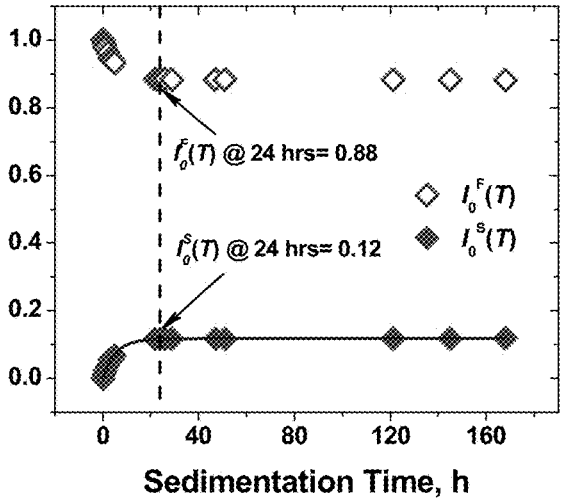
FIG. 5(b) illustrates the monitoring of the contributions from supernatant (slow, $I_0^S(T)$) and sediment (fast, $I_0^F(T)$) to the observed relaxation rate over sedimentation time for ADJU-PHOS at [Al(III)] 5.0 mg/mL. $I_0^S(T)$ and $I_0^F(T)$ are normalized such that $I_0^S(T)+I_0^F(T)=1$ for all T. Dashed vertical lines denote the sedimentation time point 24 h to calculate the 24-h average settling velocities $v_s$ in length per time units. Solid lines show corresponding single exponential growth fits of the data used to extract supernatant volume rate (SV)=0.18 $h^{-1}$. Data shown are the arithmetic means of three consecutive measurements, standard deviation in all cases is ±0.01 arb. unit (not shown for clarity).

Dependences of the pre-exponential factors $I_0^S(T)$ or $I_0^F(T)$ over the sedimentation time T (FIGS. 5(a)-5(b)) also allow one to obtain the instantaneous settling velocity of a suspension, $v_{IN}(T)$. For example, the height of a supernatant $h_{sup}(T)$ at time T relates to the initial suspension height $h_{susp}$ per Equation 11:

$$h_{sup}(T) = h_{susp} \times I_0^S(T) \tag{11}$$

Therefore, the instantaneous settling velocity $v_{IN}(T)$ would be equal to the time derivative of $h_{sup}(T)$ per Equation 12:

$$v_{IN}(T) = dh_{sup}(T)/dT = h_{susp} \times dI_0^S(T)/dT \tag{12}$$

As seen in FIGS. 5(a)-5(b), one might suggest that the dependence of $I_0^S(T)$ vs. the sedimentation time T could be analytically described by Equation 13:

$$I_0^S(T) = I_0^S[1-\exp(-T \times SV)] \tag{13}$$

where $I_0^S$ is the value of a supernatant volume or height fraction at plateau (0.42 and 0.12 for ALHYDROGEL and ADJU-PHOS, respectively, FIGS. 5(a)-5(b)), and SV is the supernatant volume rate which describes the growth of the volume or height of the supernatant layer during the sedimentation process, in h$^{-1}$. Fitting the $I_0^S(T)$ data using the Equation 13 allows to extract the values of SV, 0.08 h$^{-1}$ and 0.18 h$^{-1}$ for ALHYDRO- GEL and ADJU-PHOS, respectively. Thus, $v_{IN}(T)$ might be derived using Equation 14:

$$v_{IN}(T) = h_{susp} \times \frac{dI_0^S(T)}{dT} = h_{susp} \times I_0^S \times SV \times \exp(-T \times SV) \quad (14)$$

Based on the known $h_{susp}$ values (29 mm and 26 mm for ALHYDROGEL and ADJU-PHOS, respectively), the substitution of the above parameters into the Equation 14 allows to derive corresponding instantaneous settling velocities for both adjuvants in mm/h.

For ALHYDROGEL: $v_{IN}(T)=29\times0.42\times0.08\times\exp(-0.08\times T)=0.97\times\exp(-0.08\times T)$ For ADJU-PHOS: $v_{IN}(T)=26\times0.12\times0.18\times\exp(-0.18\times T)=0.56\times\exp(-0.18\times T)$ Importantly, the capability of wNMR to obtain the values of $v_{IN}(T)$ at any sedimentation timepoint distinguishes the technique from other approaches which require the possibility to individually track the dynamics of the settling particles.

In summary, wNMR shows the capability to track phase separation processes during the sedimentation of the adjuvant suspensions. Moreover, biexponential analysis allows one to disentangle the contributions from two phases and explore the formation of supernatant and sediment separately and simultaneously. In addition, this approach allows one to correlate the results of wNMR with other conventional techniques used to monitor sedimentation processes.

Results and Discussion—Sedimentation Volume Ratio

Unlike the early stage of sedimentation (T~2-3 h), where the CPMG echo signal I(t) starts to display clear two-component behavior only at high concentration ([Al(III)] 5.0 mg/mL), at the end of sedimentation (T=168 h), I(t) displays two-component behavior across the entire experimental concentration range ([Al(III)] 0.5-5.0 mg/mL), one slow and one fast. Similar to the above observations for sedimentation of both adjuvants at [Al(III)] 5.0 mg/mL, these two components are evidently defined by individual contributions from supernatant and sediment.

Figure 6:
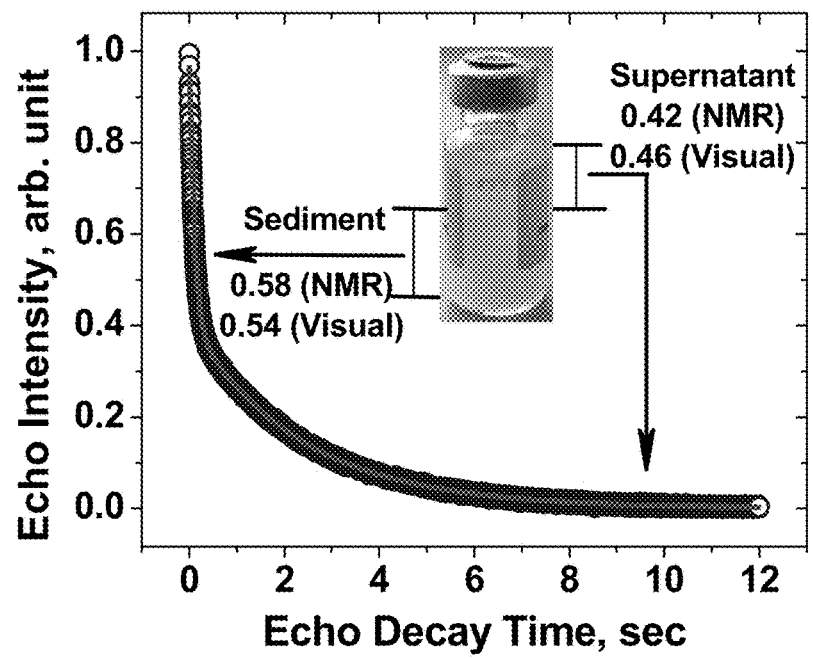
FIG. 6 illustrates an example of biexponential echo signal decay observed at the completion (168 h) of sedimentation monitoring of [Al(III)] 5.0 mg/mL sample of ALHYDROGEL. Inset photo shows actual sample vial analyzed. Separate contributions of sediment (fast decay) and supernatant (slow decay) are clearly seen. The sedimentation volume ratio from caliper measurements, $SVR^{VIS}$=15.7 mm/(15.7 mm+13.3 mm)=0.54; the sedimentation volume ratio from wNMR is the percentage of the fast decaying component, which is 0.58, i.e. $SVR^{NMR}$=0.58.

As seen from FIG. 6, biexponential fitting of the echo signal decay for the fully sedimented samples using Equation 3 allows one to derive such relative contributions from pre-exponential factors of the two water proton transverse relaxation rates in the entire concentration range. This provides an opportunity of using wNMR to determine the sedimentation volume ratio of a fully settled suspension, denoted as $SVR^{NMR}$.

To calculate the relative volume fraction of each of the two layers, the pre-exponential terms $I_0^S(T)$ for slow and $I_0^F(T)$ for fast, attributable to supernatant and sediment quantitative contributions to the observed echo signal decay, respectively, can be used. According to the Equation 7, these two pre-exponential factors can be used to calculate sedimentation volume ratio from wNMR ($SVR^{NMR}$) as the ratio of the fast sediment contribution ($I_0^F(T)$) normalized by the sum of both contributions ($I_0^F(T)+I_0^S(T)$). Table 2 lists $SVR^{NM}$ for all samples.

TABLE 2

Sedimentation volume ratios from visual measurements ($SVR^{VIS}$) and wNMR experiments ($SVR^{NMR}$)[a]

| [Al(III)], | ALHYDROGEL | | ADJU-PHOS | |
|---|---|---|---|---|
| mg/mL | $SVR^{VIS}$ | $SVR^{NMR}$ | $SVR^{VIS}$ | $SVR^{NMR}$ |
| 0.5 | 0.02 | 0.02 | 0.02 | 0.01 |
| 1.0 | 0.05 | 0.04 | 0.04 | 0.05 |
| 2.0 | 0.17 | 0.19 | 0.37 | 0.35 |
| 5.0 | 0.54 | 0.58 | 0.82 | 0.88 |

[a]$SVR^{VIS}$ were calculated using Equation 6, and $SVR^{NMR}$ were calculated using Equation 7. Values in the Table are the arithmetic means of the result of three consecutive measurements, standard deviation in all cases does not exceed ±0.01 (not shown for clarity).

The clear supernatant-sediment phase separation at the end of sedimentation (T=168 h) makes it possible to determine SVR through direct visual observation, aided by a caliper. This offers an opportunity to validate wNMR results, especially the validity of the two-component analysis.

SVR measured though visual observation, denoted as $SVR^{VIS}$, is the ratio between the height of the sediment, $h_{sed}$, and the height of the initial suspension, $h_{susp}$ (Equation 6). $h_{sed}$ and $h_{susp}$ are both measured by a caliper. Table 2 lists $SVR^{VIS}$, alongside $SVR^{NMR}$, for all samples.

Comparison of the sedimentation volume ratios, $SVR^{VIS}$ and $SVR^{NMR}$, shows very good agreement between these two sedimentation parameters derived from two different sources of the data (Table 2). Such agreement between wNMR results and visual observation supports the validity of the two-component analysis presented herein. Importantly, reliable results are obtained independent of the visibility of phase separation interface and can be noninvasive, e.g., the analysis can be performed on an original sealed vial irrespective of its transparency, labeling, etc.

Although the invention has been variously disclosed herein with reference to illustrative embodiments and features, it will be appreciated that the embodiments and features described hereinabove are not intended to limit the invention, and that other variations, modifications and other embodiments will suggest themselves to those of ordinary skill in the art, based on the disclosure herein. The invention therefore is to be broadly construed, as encompassing all such variations, modifications and alternative embodiments within the spirit and scope of the claims hereafter set forth.

REFERENCES

Baldock, T. E.; Tomkins. M. R.; Nielsen, P.; Hughes, M. G. Settling velocity of sediments at high concentrations. *Coast. Eng.* 2004, 51, 91-100.

Barfod, N. Concentration dependence of sedimentation rate of particles in dilute suspensions. *Powder Technol.* 1972, 6, 39-43.

CRC Handbook of Chemistry and Physics, Eds. W. M. Haynes, D. R. Lide, T. J. Bruno, 95th Edition, Boca Raton, CRC Press 2014.

Davies, R. The experimental study of the differential settling of particles in suspensions at high concentrations. *Powder Technol.* 1968, 2, 43-51.

Dey, S.; Ali, S. Z.; Padhi, E. Terminal fall velocity: The legacy of Stokes from the perspective of fluvial hydraulics. *Proc. R. Soc. A* 2019, 475, 20190277.

Exley, C.; Siesjö, P.; Eriksson, H. The immunobiology of aluminum adjuvants: How they really work? *Trends Immunol.* 2010, 31, 103-109.

Farrell, C. Analytical control strategies for aluminum adjuvants. WCBP 2014, https://www.casss.org/resource/resmgr/WCBP_Speaker_Slides/2014_WCBP_Chris_Farrell.pdf Fox, C. B. Characterization of TLR4 agonist effects of Alhydrogel® sedimentation: A novel application of laser scattering optical profiling. *J. Pharm. Sci.* 2012, 101, 4357-4364.

Guo, J.; Lewis, L. M.; Billones, H.; Torres, E.; Kolhe, P. The effect of shipping stresses on vaccine re-dispersion time. *J. Pharm. Sci.* 2016, 105, 2009-2013.

Gupta, R. K. aluminum compounds as vaccine adjuvants. *Adv. Drug Deliv. Rev.* 1998, 32, 155-172.

Hiestand, E. N. Theory of coarse suspension formulation. *J. Pharm. Sci.* 1964, 53, 1-18.

HogenEsch, H.; O'Hagan, D. T.; Fox, C. B. Optimizing the utilization of aluminum adjuvants in vaccines: you might just get what you want. *NPJ Vaccines* 2018, 3, 51.

Jayaweera, K. O. L. F.; Mason, B. J.; Slack, G. W. The behavior of clusters falling in a viscous fluid. *J. Fluid. Mech.* 1964, 20, 121-128.

Jovanovic, D. S. A quantitative study of orthokinetic flocculation in suspension. Kolloid-Z. *Polymere* 1965, 203, 42-56.

Kurzatowski, W.; Kartoğlu, Ü.; Staniszewska, M.; Górska, P.; Krause, A.; Wysocki, M. J. Structural damages in adsorbed vaccines affected by freezing. *Biologics* 2013, 41, 71-76.

Kurzatowski, W.; Kartoğlu, Ü.; Górska, P.; Glówka, M.; Woźnica, K.; Zasada, A. A.; Szczepańska, G.; Trykawski, G.; Gniadek, M.; Donten, M. Physical and chemical changes in Alhydrogel™ damaged by freezing. *Vaccine* 2018, 36, 6902-6910.

Langford, A.; Horwitz, T.; Adu-Gyamfi, E.; Wiley, C.; Holding, E.; Zimmermann, D.; Ignatius, A. A.; Ohtake, S. Impact of formulation and suspension properties on redispersion of aluminum-adjuvanted vaccines. *J. Pharm. Sci.* 2020, 109, 1460-1466.

Lewis, L. M.; Guo, J.; Torres, E.; Wang, J.; Billones, H.; Kolhe, P.; Young, A. L.; Bates, D.; Parker, A.; Rigby-Singleton, S. Ex situ and in situ characterization of vaccine suspensions in pre-filled syringes. *J. Pharm. Sci.* 2017, 106, 2163-2167.

Meiboom, S.; Gill, D. Modified spin-echo method for measuring nuclear relaxation times. *Rev. Sci. Instrum.* 1958, 29, 688-691.

Muthurania, K.; Ignatius, A. A.; Jin, Z.; Williams, J.; Ohtake, S. Investigation of the sedimentation behavior of aluminum phosphate: Influence of pH, ionic strength, and model antigens. *J. Pharm. Sci.* 2015, 104, 3770-3778.

Nutan, M. T. H.; Reddy, I. R. General principles of suspensions. In: Kulshreshita, A.; Singh, O.; Wall, G. (eds.) *Pharmaceutical Suspensions: From Formulation to Manufacturing*, New York, Springer 2010, 39-65.

Reed, S. G.; Orr, M. T.; Fox, C. B. Key roles of adjuvants in modern vaccines. *Nat. Med.* 2013, 19, 1597-1608.

Salnikova, M. S.; Davis, H.; Mensch, C.; Celano, L.; Thiriot, D. S. Influence of formulation pH and suspension state on freezing-induced agglomeration of aluminum adjuvants. *J. Pharm. Sci.* 2012, 101, 1050-1062.

Shardlow, E.; Mold, M.; Exley, C. From stock bottle to vaccine: Elucidating the particle size distributions of aluminum adjuvants using dynamic light scattering. *Front. Chem.* 2017, 4, 48.

Taraban, M. B.; Fox, C. B.; Yu, Y. B. Assessing aluminum vaccine adjuvant filling, sedimentation, and resuspension in sealed vials using water proton NMR. *Am. Pharm. Rev.* 2019, 22, 70-73.

Vecchi, S.; Bufali, S.; Skribinski, D. A. G.; O'Hagan, D. T.; Singh, M. Aluminum adjuvant dose guidelines in vaccine formulation for preclinical evaluations. *J. Pharm. Sci.* 2012, 101, 17-20.

What is claimed is:

1. A method of determining a sedimentation rate of solids in a multiphase mixture sample using wNMR, said method comprising:
    inserting a vial comprising the multiphase mixture sample into a nuclear magnetic resonance (NMR) spectroscopy probe;
    determining a transverse relaxation rate of water $R_2(^1H_2O, T)$ of the multiphase mixture sample at time T over a total time $T_{total}$;
    calculating the multiphase mixture sample sedimentation rate ($SR_{sample}$); and
    comparing the multiphase mixture sample $SR_{sample}$ to an approved control sedimentation rate ($SR_{cont}$) for the multiphase mixture, wherein if the multiphase mixture sample $SR_{sample}$ is outside of an acceptable range of the approved $SR_{cont}$, the multiphase mixture sample is less stable relative to an approved multiphase mixture.

2. The method of claim 1, wherein the multiphase mixture comprises a drug substance.

3. The method of claim 2, wherein the drug substance comprises at least one active pharmaceutical ingredient (API) in an aqueous medium.

4. The method of claim 1, wherein the multiphase mixture is an emulsion, a suspension, a foam, or a solution.

5. The method of claim 1, wherein the vial remains sealed during the method and wNMR measurements are made in situ.

6. The method of claim 1, wherein the method does not rely on visualization, does not rely on the use or measurement of photons, and is performed without introducing any additives to the multiphase mixture sample prior to measurement.

7. The method of claim 1, wherein the multiphase mixture sample is a generic version of an approved multiphase mixture control, and wherein when $SR_{sample}$ is outside of an acceptable range of the approved $SR_{cont}$, the generic version should not be approved.

8. The method of claim 1, wherein the multiphase mixture sample is a suspected counterfeit of an approved multiphase mixture control, and wherein when $SR_{sample}$ is outside of an acceptable range of the approved $SR_{cont}$, the sample is a counterfeit of the approved multiphase mixture.

9. The method of claim 1, wherein a $SR_{sample}$ value outside of an acceptable range of the approved $SR_{cont}$ is indicative of an occurrence of at least one destabilization process selected from creaming, sedimentation, flocculation, and/or coalescence.

10. A computer program product comprising a computer readable non-transitory storage medium comprising instructions executable by a computing device to cause the computing device to perform the method of claim 1.

* * * * *